(12) United States Patent
Choi et al.

(10) Patent No.: US 12,089,439 B2
(45) Date of Patent: Sep. 10, 2024

(54) HEAT RADIATION MEMBER FOR FLEXIBLE DISPLAY AND ELECTRONIC DEVICE USING THE SAME

(71) Applicant: LG Display Co., Ltd., Seoul (KR)

(72) Inventors: Kou Choi, Paju-si (KR); Junjae Lee, Paju-si (KR); JongHyuk Kim, Paju-si (KR); Kwangju Lee, Paju-si (KR); Junho Yun, Paju-si (KR); Myeongah Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/096,313

(22) Filed: Jan. 12, 2023

(65) Prior Publication Data

US 2023/0157066 A1 May 18, 2023

Related U.S. Application Data

(63) Continuation of application No. 16/707,924, filed on Dec. 9, 2019, now Pat. No. 11,581,516.

(30) Foreign Application Priority Data

Dec. 17, 2018 (KR) .......................... 10-2018-0163393

(51) Int. Cl.
*H10K 50/87* (2023.01)
*H10K 50/84* (2023.01)
(Continued)

(52) U.S. Cl.
CPC ............. *H10K 50/87* (2023.02); *H10K 50/84* (2023.02); *H10K 59/12* (2023.02); *H10K 59/40* (2023.02);
(Continued)

(58) Field of Classification Search
CPC .............................. H10K 50/87; H10K 77/111
See application file for complete search history.

(56) References Cited

U.S. PATENT DOCUMENTS

2015/0062844 A1 3/2015 Bae et al.
2016/0268523 A1 9/2016 Kim et al.
(Continued)

FOREIGN PATENT DOCUMENTS

CN 206147209 U * 5/2017
CN 108806508 A 11/2018
(Continued)

OTHER PUBLICATIONS

Definition of "attached", http://www.merriam-webster.com (2022) (Year: 2022).

*Primary Examiner* — Michele Fan
(74) *Attorney, Agent, or Firm* — Birch, Stewart, Kolasch & Birch, LLP

(57) ABSTRACT

A flexible display including a flexible display module having a flexible substrate on which a pixel array is formed, a heat radiation sheet portion disposed on a lower surface of the flexible substrate, a display portion and a bending display portion, a cover window disposed on an upper surface of the flexible display module, the cover window including a sidewall portion overlapping the bending display portion of the flexible display module, a middle frame disposed on a rear surface of the flexible display module, the middle frame including a groove portion, a back cover disposed on a rear surface of the middle frame, and a storage space is provided between the groove portion and the back cover.

20 Claims, 8 Drawing Sheets

(51) Int. Cl.
　　　*H10K 59/12*　　　(2023.01)
　　　*H10K 59/40*　　　(2023.01)
　　　*H10K 71/00*　　　(2023.01)
　　　*H10K 77/10*　　　(2023.01)
　　　*H10K 102/00*　　(2023.01)

(52) U.S. Cl.
　　　CPC ........... *H10K 71/00* (2023.02); *H10K 77/111* (2023.02); *H10K 2102/311* (2023.02)

(56) References Cited

U.S. PATENT DOCUMENTS

| | | | |
|---|---|---|---|
| 2018/0197933 A1* | 7/2018 | Son | H10K 59/123 |
| 2018/0366679 A1* | 12/2018 | Kim | B32B 27/10 |
| 2019/0341958 A1 | 11/2019 | Coverstone | |
| 2020/0057545 A1* | 2/2020 | Seomoon | H05K 1/189 |
| 2020/0169623 A1* | 5/2020 | Shin | G06F 1/203 |

FOREIGN PATENT DOCUMENTS

| KR | 10-2017-0004068 A | 1/2017 |
|---|---|---|
| KR | 10-2018-0082717 A | 7/2018 |

\* cited by examiner

HEAT RADIATION MEMBER FOR FLEXIBLE DISPLAY AND ELECTRONIC DEVICE USING THE SAME

CROSS-REFERENCE TO RELATED APPLICATIONS

This application is a Continuation of U.S. patent application Ser. No. 16/707,924, filed on Dec. 9, 2019, which claims the priority benefit of the Korean Patent Application No. 10-2018-0163393 filed in the Republic of Korea on Dec. 17, 2018, which is hereby incorporated by reference in its entirety for all purposes as if fully set forth herein.

BACKGROUND

Technical Field

The present disclosure relates to a heat radiation member for a flexible display, and an electronic device using the same.

Discussion of the Related Art

Generally, an electronic device such as a television, a monitor, a notebook computer, a smart phone, a tablet computer, an electronic pad, a wearable device, a watch phone, a mobile information device, a navigation, or a vehicle control display device is realized in a multimedia player type having complex function of an image displaying, photo shooting or video recording, audio or video file playing, game, or broadcasting receiving.

The electronic device can include a cover window, a flexible display module (unit) having a flexible display panel supported by the cover window and a heat radiation sheet attached to a rear surface of the flexible display panel, a display driving circuit portion connected with the flexible display panel, and a housing configured to receive the flexible display module and the display driving circuit portion. The flexible display panel can include a panel bending portion which is bent in a curved-line shape (e.g. has a curved-line or curved shape) so as to reduce a bezel width of the electronic device, and a bending panel fixing member configured to maintain a bending state in the panel bending portion which is bent in a curved-line shape (e.g. has a curved-line or curved shape).

In the related art electronic device, a pane bending process of the flexible display panel can include a process of attaching the heat radiation sheet to a rear surface of the flexible display panel, a process of attaching a bending maintenance member to the flexible display panel, and a process of bending a panel bending portion of the flexible display panel in a curved-line shape and attaching the panel bending portion being in the bent state to the bending panel fixing member.

For the panel bending process of the flexible display panel, the attachment process of the heat radiation sheet and the attachment process of the bending panel fixing member are carried out separately so that it is difficult to simplify a manufacturing process and to reduce a process tact time.

Also, in the related art electronic device, heat generated in the flexible display panel can be radiated through the use of heat radiation sheet. However, heat generated in the display driving circuit portion can be transmitted to the flexible display panel through the heat radiation sheet so that it has limitations on radiation of the heat generated in the flexible display module through the use of heat radiation sheet.

And, in the related art electronic device, a rear light leakage can occur in the flexible display panel through a gap space between the heat radiation sheet and the bending panel fixing member.

The above content of the background technology can be retained for a deduction of the present disclosure by inventors, or can be technology information learned by practice of embodiments of the present disclosure. However, the above content of the background technology can be not a prior art published to the general public before an application of the present disclosure.

SUMMARY

The present disclosure has been made in view of the above problems, and it is an object of the present disclosure to provide a heat radiation member for a flexible display having a bending panel fixing member, and an electronic device using the same.

It is another object of the present disclosure to provide an electronic device with an improved heat radiation efficiency.

In addition to the objects of the present disclosure as mentioned above, additional objects of the present disclosure will be clearly understood by those skilled in the art from the following description of the present disclosure.

According to an embodiment, the present disclosure provides a heat radiation member for a flexible display comprises a heat radiation sheet portion including a metal layer, a bending panel fixing member attached to a first area in a first surface of the heat radiation sheet portion, a spacer attached to a second area in the first surface of the heat radiation sheet portion, a dummy double sided tape attached to the spacer, an upper delamination film configured to cover an entire area of a second surface of the heat radiation sheet portion, the second surface of the heat radiation sheet portion being different than the first surface of the heat radiation sheet portion, and a lower delamination film configured to cover an entire area of the dummy double sided tape and an entire area of the bending panel fixing member.

In accordance with an aspect of the present disclosure, the above and other objects can be accomplished by the provision of a heat radiation member for a flexible display comprising a heat radiation sheet portion including a metal layer; a bending panel fixing member attached to a first area predetermined in one surface of the heat radiation sheet portion; a spacer attached to a second area predetermined in one surface of the heat radiation sheet portion; a dummy double sided tape combined with the spacer; an upper delamination film configured to cover an entire area of the other surface of the heat radiation sheet portion; and a lower delamination film configured to cover an entire area of the dummy double sided tape and an entire area of the bending panel fixing member.

In accordance with another aspect of the present disclosure, there is provided an electronic device comprising a flexible display module combined with a cover window; a middle frame configured to support the cover window and combined with the flexible display module; and a back cover configured to cover a rear surface of the middle frame, wherein the flexible display module includes a flexible display panel including a display portion, a panel bending portion and a display pad portion; a heat radiation sheet portion combined with a rear surface of the flexible display panel; a bending panel fixing member attached to one edge portion of the heat radiation sheet portion and configured to fix the panel bending portion has a curved-line shape; and a frame fixing member attached between the heat radiation sheet portion and the middle frame.

According to one or more embodiments of the present disclosure, it is possible to carry out the attachment process of the heat radiation sheet portion and the attachment process of the bending panel fixing member, at the same time, for the manufacturing process of the flexible display module, to thereby simplify the panel bending process of the flexible display module, and to shorten a process tact time.

According to one or more embodiments of the present disclosure, it is possible to prevent the non-adhesion area (or non-compressed area) caused by the step difference between the heat radiation sheet portion and the bending panel fixing member for the laminating process of attaching the heat radiation sheet portion to the flexible display panel, to thereby enable the uniform entire adhesion between the flexible display panel and the heat radiation sheet portion.

According to one or more embodiments of the present disclosure, the heat of the heat radiation sheet portion attached to the flexible display panel is discharged through the middle frame so that it is possible to improve the heat radiation efficiency of the electronic device.

In addition to the effects of the present disclosure as mentioned above, additional advantages and features of the present disclosure will be clearly understood by those skilled in the art from the above description of the present disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, that can be included to provide a further understanding of the disclosure and are incorporated in and constitute a part of this application, illustrate embodiments of the disclosure and together with the description serve to explain various principles of the disclosure.

DETAILED DESCRIPTION OF THE DISCLOSURE

Figure 1:
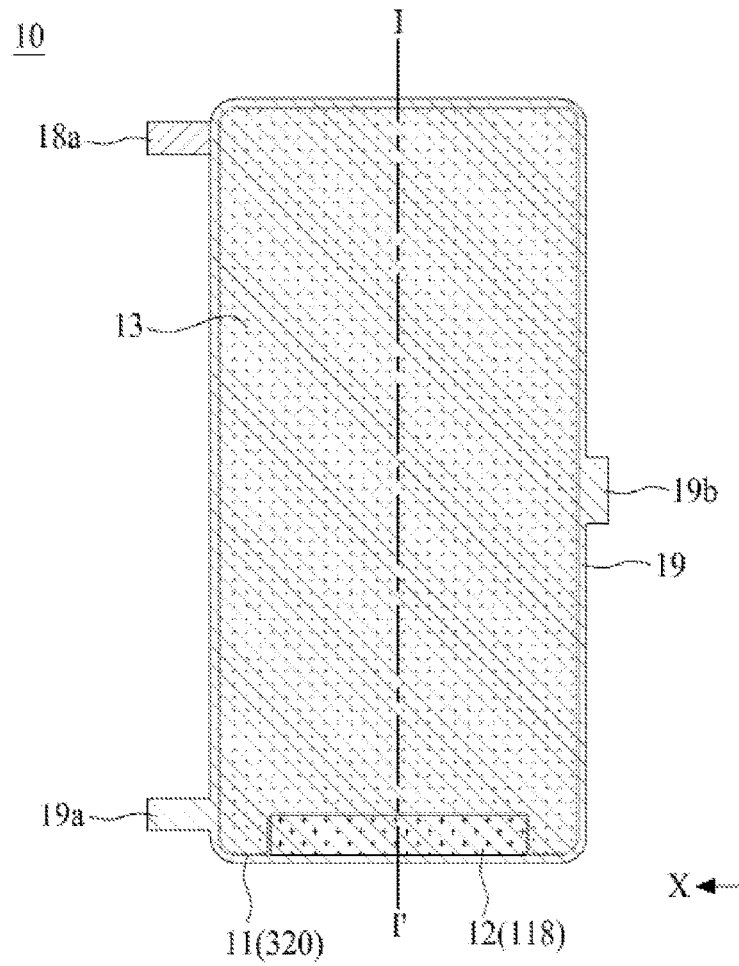
FIG. 1 is a plane view illustrating a heat radiation member for a flexible display according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next-to', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure can be partially or overall coupled to or combined with (e.g., bonded to, attached to, etc.) each other, and can be variously inter-operated with each other and driven technically as those skilled in the art can sufficiently understand. The embodiments of the present disclosure can be carried out independently from each other, or can be carried out together in co-dependent relationship.

Hereinafter, a heat radiation member for a flexible display and an electronic device comprising the same according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
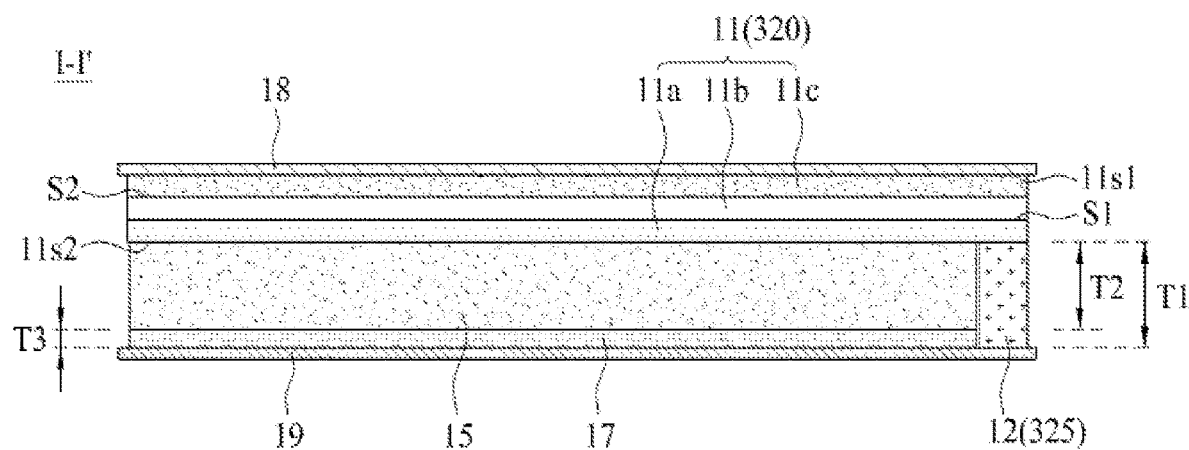
FIG. 2 is a cross-sectional view taken along line I-I' of FIG. 1.

FIG. 1 is a plane view illustrating a heat radiation member for a flexible display according to one embodiment of the present disclosure. FIG. 2 is a cross-sectional view taken along line I-I' of FIG. 1.

Referring to FIGS. 1 and 2, the heat radiation member for a flexible display according to the first embodiment of the present disclosure can include a heat radiation sheet portion 11, a bending panel fixing member 12, a spacer 15, a dummy double-sided tape 17, an upper delamination (or separation) film 18, and a lower delamination film 19.

The heat radiation sheet portion 11 can configure to include a metal layer configured to radiate heat transmitted from a display module. The heat radiation sheet portion 11 according to one embodiment of the present disclosure can include a heat radiation sheet 11a, a cushion sheet 11b, and an adhesion layer 11c.

The heat radiation sheet 11a can include a heat radiation layer having a metal material with a relatively high thermal conductivity. The heat radiation sheet 11a according to one embodiment of the present disclosure can include a metal layer of copper. The heat radiation sheet 11a according to another embodiment of the present disclosure can include a metal layer of copper, and a graphite layer coated onto the metal layer. The heat radiation sheet 11a can radiate the heat by distributing the transmitted heat.

The cushion sheet 11b is connected with a first surface (or front surface) S1 of the heat radiation sheet 11a, and is configured to absorb a shock. The cushion sheet 11b according to one embodiment of the present disclosure can be a double-sided foam adhesive tape or a double-sided foam adhesive pad.

The adhesion layer 11c can be connected with a first surface (or front surface) S2 of the cushion sheet 11b. The adhesion layer 11c according to one embodiment of the present disclosure can include a first surface S2 adhered to the first surface S1 of the cushion sheet 11b, and a second surface 11s1 which is opposite to the first surface S2. The second surface 11s1 of the adhesion layer 11c can include an uneven surface structure (or embossing structure).

The uneven surface structure of the adhesion layer 11c prevents bubble from being generated between a display panel and the heat radiation member 10 for a process of attaching the heat radiation member 10 to a rear surface of the display panel so that it is possible to omit a deformation process for removing bubbles generated between the display panel and the heat radiation member 10.

In the heat radiation sheet portion 11, the second surface 11s1 of the adhesion layer 11c can be defined as a front surface (or one surface) of the heat radiation sheet portion 11. Further, a second surface 11s2 of the heat radiation sheet portion 11, which is opposite to the first surface 11s1 of the heat radiation layer 11c, can be defined as a rear surface (or the other surface) of the heat radiation sheet portion 11.

The bending panel fixing member 12 can be attached onto a fixing member arrange area (or first area), which can be a predetermined surface of the heat radiation sheet portion 11. For example, the bending panel fixing member (or first fixing member) 12 can be disposed to have a first thickness T1 on one edge portion of the rear surface 11s2 of the heat radiation sheet portion 11.

The bending panel fixing member 12 according to one embodiment of the present disclosure can be a double-sided tape. For example, the bending panel fixing member 12 can be a flexible double-sided tape, but is not limited thereto.

The bending panel fixing member 12 according to another embodiment of the present disclosure can be a double-sided conductive tape. For example, the double-sided conductive tape can include a conductive layer and a cushion layer interposed between a lower adhesion layer and an upper adhesion layer. In this case, the conductive layer can include a metal layer of copper, or can further include a graphite layer coated onto the metal layer.

The bending panel fixing member 12 according to another embodiment of the present disclosure can include a bar-shaped fixing bar, a front adhesive layer formed on a front surface of the fixing bar, and a rear adhesive layer formed on a rear surface of the fixing bar. The fixing bar can be formed of a rigid material such as plastic, but is not limited to this material. The bending panel fixing member 12 can have a rectilinear shape, such as a rectangular shape.

The spacer 15 can be attached onto a step difference compensation area (or second area) set in one surface of the heat radiation sheet portion 11. For example, the spacer 15 can be disposed to have a second thickness T2 on the remaining portions except one edge portion in the rear surface 11s2 of the heat radiation sheet portion 11. The second thickness T2 of the spacer 15 can be smaller than the first thickness T1 of the bending panel fixing member 12. The spacer 15 according to one embodiment of the present disclosure can be formed of a rigid material or a flexible material, or can be formed of the same material as that of the bending panel fixing member 12. The spacer 15 compensates for a step difference between one edge portion of the rear surface 11s2 of the heat radiation sheet portion 11 in which the bending panel fixing member 12 is disposed, and the remaining portions of the rear surface 11s2 of the heat radiation sheet portion 11.

The dummy double-sided tape 17 can be attached to a rear surface of the spacer 15. For example, the dummy double-sided tape 17, which has the same two-dimensional size or shape as that of the spacer 15, can be combined with (e.g., bonded to, attached to, etc.) a rear surface of the spacer 15. In other words, the dummy double-sided tape 17 can be pre-attached to the rear surface of the spacer 15 prior to assembly onto the heat radiation member.

The dummy double-sided tape 17 according to one embodiment of the present disclosure can have a third thickness T3 corresponding to a value (T1−T2) which is obtained by subtracting the second thickness T2 of the spacer 15 from the first thickness T1 of the bending panel fixing member 12. Accordingly, a total value (T2+T3) obtained by adding the second thickness T2 of the spacer 15 and the third thickness T3 of the dummy double-sided tape 17 can be identical to the first thickness T1 of the bending panel fixing member 12 within a manufacturing process error range. The dummy double-sided tape 17 can compensate for the step difference between the bending panel fixing member 12 and the spacer 15, and can peel off the spacer 15 from the heat radiation sheet portion 11. In this case, an adhesion strength between the dummy double-sided tape 17 and the spacer 15 is relatively larger than an adhesion strength between the spacer 15 and the heat radiation sheet portion 11 so that the dummy double-sided tape 17 and the spacer 15 can be peeled off all together from the heat radiation sheet portion 11. Thus, the spacer 15 can be separated together with the delamination of the dummy double-sided tape 17.

The upper delamination film (or upper protection film) 18 can be disposed to cover the entire area of the front surface (or the other surface) 11s1 of the heat radiation sheet portion 11. For example, the upper delamination film 18 can be attached to the second surface 11s1 of the adhesion layer 11c included in the heat radiation sheet portion 11. The upper delamination film 18 can protect the front surface of the heat radiation sheet portion 11, and can expose the second surface 11s1 of the adhesion layer 11c included in the heat radiation sheet portion 11. The second surface 11s1 of the adhesion layer 11c exposed by the delamination of the upper delamination film 18 can be combined with (e.g., bonded to, attached to, etc.) the rear surface of the flexible display panel.

Additionally, the upper delamination film 18 can further include at least one upper delamination knob 18a protruding or extending from one side of the upper delamination film 18. The upper delamination knob 18a can serve as a knob that is configured to peel off the upper delamination film 18 from the heat radiation member 10 for a flexible display.

The lower delamination film (or lower protection film) 19 can be disposed to cover the entire area of the dummy double-sided tape 17 and the bending panel fixing member 12 disposed in the rear surface 11s2 of the heat radiation sheet portion 11. For example, the lower delamination film 19 has the same two-dimensional size or shape as that of the heat radiation sheet portion 11, or has a relatively larger size in comparison to the heat radiation sheet portion 11, whereby the lower delamination film 19 can be attached to the bending panel fixation 12 and the dummy double-sided tape 17. The lower delamination film 19 can protect the front surface in each of the bending panel fixing member 12 and the dummy double-sided tape 17, and can peel off the dummy double-sided tape 17 and the spacer 15, at the same time, from the heat radiation sheet portion 11. The bending panel fixing member 12 can be exposed by the delamination of the dummy double-sided tape 17 and the spacer 15 from the heat radiation sheet portion 11 can be combined with (e.g., bonded to, attached to, etc.) the panel bending portion of the flexible display panel.

An adhesion strength between the lower delamination film 19 and the bending panel fixing member 12 can be relatively weaker than an adhesion strength between the heat radiation sheet portion 11 and the bending panel fixing member 12. For example, an adhesion strength between the heat radiation sheet portion 11 and the bending panel fixing member 12 can be greater than an adhesion strength between the lower delamination film 19 and the bending panel fixing member 12 so as to prevent the bending panel fixing member 12 from being peeled off from the heat radiation sheet portion 11 by the delamination of the lower delamination film 19.

An adhesion strength between the lower delamination film 19 and the dummy double-sided tape 17 can be greater than ah adhesion strength between the heat radiation sheet portion 11 and the spacer 15. For example, an adhesion strength between the heat radiation sheet portion 11 and the spacer 15 can be weaker than an adhesion strength between the lower delamination film 19 and the dummy double-sided tape 17 so as to peel off the spacer 15 and the dummy double-sided tape 17, at the same time, from the heat radiation sheet portion 11 by the delamination of the lower delamination film 19. For example, the spacer 15 and the dummy double-sided tape 17 can be simultaneously peeled off from the heat radiation sheet portion 11.

Additionally, the lower delamination film 19 can further include at least one lower delamination knob 19a protruding or extending from one side of the lower delamination film 19. The lower delamination knob 19a can serve as a knob configured to peel off the lower delamination film 19 from the heat radiation member 10 for a flexible display.

Also, the lower delamination film 19 can further include a support wing 19b protruding or extending from the other side of the lower delamination film 19. The support wing 19b temporarily supports the display driving circuit portion connected with the flexible display panel for an assembly process of the display module so that it is possible to prevent the display driving circuit portion from being bent or broken, and to prevent a physical contact between structures.

Accordingly, the heat radiation member 10 for a flexible display according to the first embodiment of the present disclosure includes the heat radiation sheet portion 11, and the bending panel fixing member 12 disposed in the heat radiation sheet portion 11 so that it is possible to carry out the attachment process of the heat radiation sheet portion 11 and the attachment process of the bending panel fixing member 12, at the same time, for the manufacturing process of the flexible display module, to thereby simplify the panel bending process of the flexible display panel, and to shorten a process tact time. Also, the heat radiation member 10 for a flexible display according to the first embodiment of the present disclosure includes the dummy double-sided tape 17 and the spacer 15 configured to compensate for the step difference between the heat radiation sheet portion 11 and the bending panel fixing member 12, so that it is possible to prevent an non-adhesion area (or non-compressed area) caused by the step difference between the heat radiation sheet portion 11 and the bending panel fixing member 12 for a laminating process of attaching the heat radiation sheet portion 11 to the flexible display panel, to thereby enable the uniform entire adhesion between the flexible display panel and the heat radiation sheet portion 11.

Figure 3:
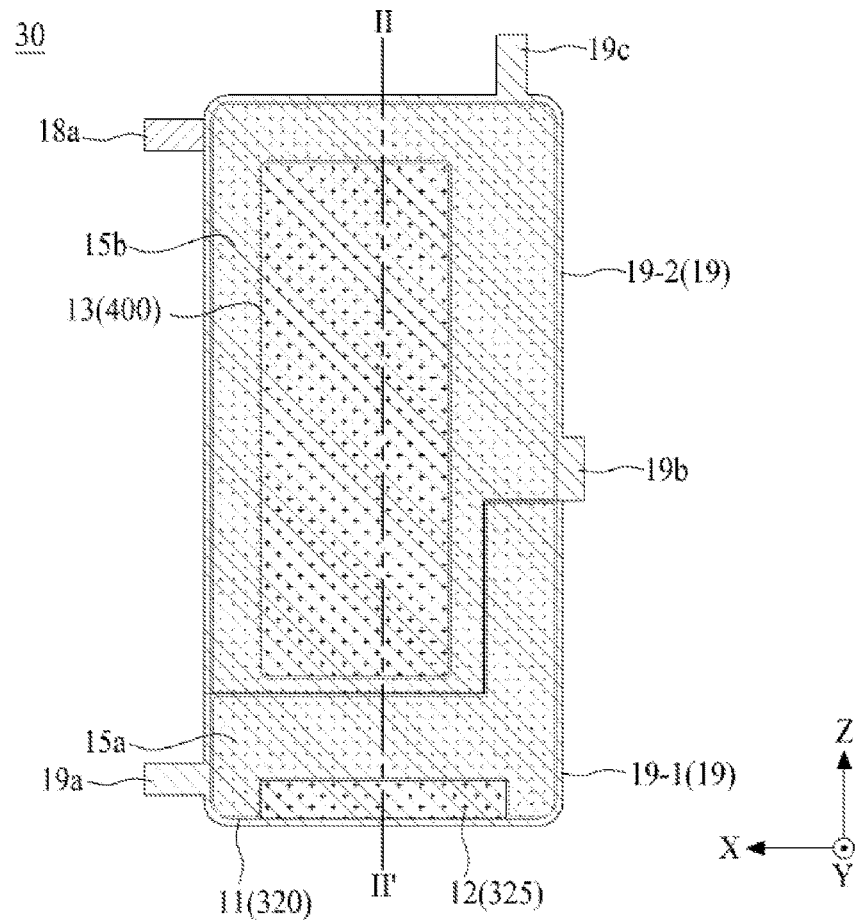
FIG. 3 is a plane view illustrating a heat radiation member for a flexible display according to the second embodiment of the present disclosure.
Figure 4:
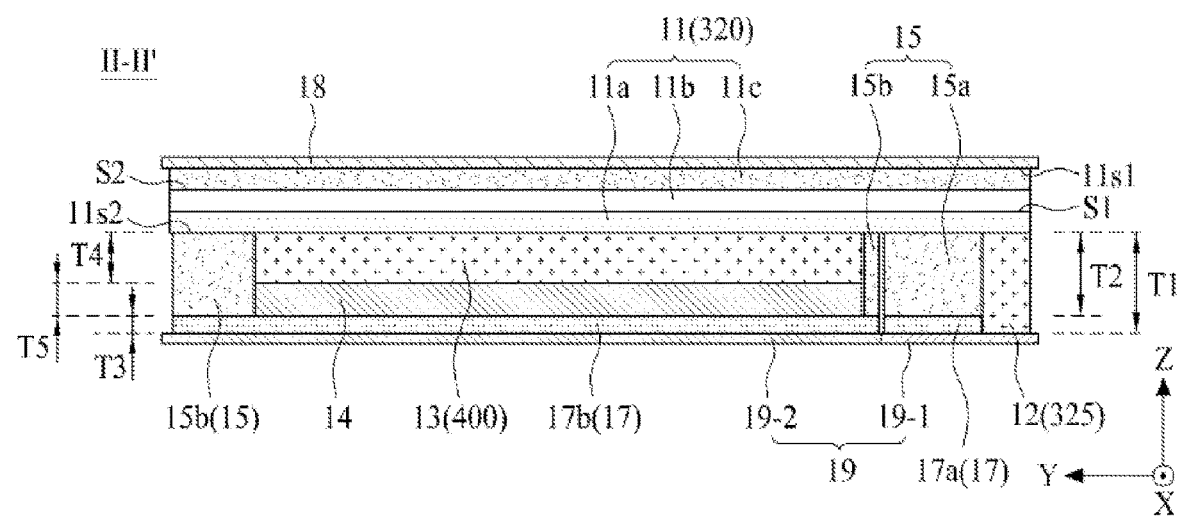
FIG. 4 is a cross-sectional view taken along line II-II' of FIG. 3.

FIG. 3 is a plane view illustrating a heat radiation member for a flexible display according to the second embodiment of the present disclosure. FIG. 4 is a cross-sectional view taken along line II-II' of FIG. 3.

Referring to FIGS. 3 and 4, the heat radiation member 10 for a flexible display according to the second embodiment of the present disclosure can include a heat radiation sheet portion 11, a bending panel fixing member 12, a frame fixing member 13, a middle delamination film 14, a spacer 15, a dummy double-sided tape 17, an upper delamination film 18, and a lower delamination film 19.

The heat radiation sheet portion 11 can include a metal material configured to radiate heat transmitted from a display module. The heat radiation sheet portion 11 according to one embodiment of the present disclosure can include a heat radiation sheet 11a, a cushion sheet 11b, and an adhesion layer 11c. The elements included in the heat radiation sheet portion 11 are identical to those of the heat radiation sheet portion shown in FIG. 2, whereby the same reference numerals are used throughout the drawings to refer to the same parts, and a detailed repetitive description for the same parts will be omitted.

The bending panel fixing member 12 can be attached onto a first fixing member arrangement area (or first area) arranged in one surface of the heat radiation sheet portion 11. For example, the bending panel fixing member 12 (or first fixing member) can be disposed while being configured to have a first thickness T1 on one edge portion of a rear surface 11s2 of the heat radiation sheet portion 11. The bending panel fixing member 12 is identical to the bending panel fixing member shown in FIG. 2, whereby the same reference numerals are used throughout the drawings to refer to the same parts, and a detailed repetitive description for the same parts will be omitted.

The frame fixing member 13 can be attached onto a second fixing member arrangement area (or third area), which is a predetermined surface of the heat radiation sheet portion 11. In this case, the frame fixing member 13 can be disposed in the second fixing member arrangement area (or third area) between the area for the bending panel fixing member 12 (or first area) and the area for the spacer 15 (or second area), the area for the spacer 15 is another predetermined surface of the heat radiation sheet portion 11. For example, the frame fixing member 13 can be disposed in at least some portions of the remaining portions except one edge portion of the rear surface 11s2 of the heat radiation sheet portion 11, while being spaced apart from the bending panel fixing member 12. However, the frame fixing member 13 can be attached to any number of edge portions of the rear surface 11s2 of the heat radiation sheet portion 11. For example, in the electronic device, the frame fixing member 13 can have a fourth thickness T4 based on a distance between a middle frame and the heat radiation sheet portion 11 attached to a rear surface of a flexible display panel. In this case, the fourth thickness T4 of the frame fixing member 13 can be smaller than the first thickness T1 of the bending panel fixing member 12.

The frame fixing member 13 according to one embodiment of the present disclosure can be a double-sided tape having the fourth thickness T4. For example, the frame fixing member 13 can be a double-sided insulating tape. In this case, in the electronic device, the frame fixing member 13 according to one embodiment of the present disclosure can be configured to combine (or be attached to) the heat radiation sheet portion 11, which is attached to the rear surface of the flexible display panel, with the middle frame.

The frame fixing member 13 according to another embodiment of the present disclosure can be a double-sided conductive tape. For example, the frame fixing member 13 can include a conductive plate (or metal thin film or thin film comprising a metal material), a first conductive adhesion layer formed in a front surface of the conductive plate and adhered to the heat radiation sheet 11a of the heat radiation sheet portion 11, and a second conductive adhesion layer formed in a rear surface of the conductive plate. The front surface of the conductive plate being opposite to the rear surface of the conductive plate. In this case, in the electronic device, the frame fixing member 13 according to another embodiment of the present disclosure can combine (or be attached to) the heat radiation sheet portion 11 attached to the rear surface of the flexible display panel with the middle frame, and can serve heat transmission and heat radiation functions by transmitting heat of the heat radiation sheet portion 11 to the middle frame and radiating the transmitted heat. For example, the heat radiation sheet portion 11 can be a heat sink, and can in contact with the middle frame to radiate heat to the middle frame.

The middle delamination film 14 can be attached onto the frame fixing member 13. For example, the middle delamination film 14 can have the same size or shape as that of the frame fixing member 13, two-dimensionally, and can be attached to a rear surface of the frame fixing member 13. In this case, in order to make the middle delamination film 14 be easily peeled off from the frame fixing member 13, an adhesion strength between the middle delamination film 14 and the frame fixing member 13 is relatively weaker than an adhesion strength between the frame fixing member 13 and the heat radiation sheet portion 11. Thus, the frame fixing member 13 is not peeled off from the heat radiation sheet portion 11 even though the middle delamination film 14 is peeled off from the heat radiation sheet portion 11.

The middle delamination film 14 according to one embodiment of the present disclosure can have a fifth thickness T5 which is smaller than the first thickness T1 of the bending panel fixing member 12, wherein the fifth thickness T5 of the middle delamination film 14 can be the same as or different from the fourth thickness T4 of the frame fixing member 13. In this case, a total value (T4+T5) obtained by adding the fourth thickness T4 of the frame fixing member 13 to the fifth thickness T5 of the middle delamination film 14 can be smaller than the first thickness T1 of the bending panel fixing member 12. The middle delamination film 14 can compensate for the first step difference between the bending panel fixing member 12 and the middle delamination film 14.

The spacer 15 can be attached onto a step difference compensation area (or second area) provided in one surface of the heat radiation sheet portion 11. For example, the spacer 15 can be provided to compensate for the step difference between the rear surface of 11s2 of the heat radiation sheet portion 11 and each of the bending panel fixing member 12 and the middle delamination film 14. The spacer 15 can be provided in plurality. The spacer 15 according to one embodiment of the present disclosure can include a first spacer 15a and a second spacer 15b.

The first spacer 15a can be disposed, while being configured to have a second thickness T2, on the rear surface 11s2 of the heat radiation sheet portion 11, between the bending panel fixing member 12 and the frame fixing member 13. The second thickness T2 of the first spacer 15a can be smaller than a first thickness T1 of the bending panel fixing member 12. In this case, the second thickness T2 of the first spacer 15a can be identical to the total value (T4+T5) obtained by adding the fourth thickness T4 of the frame fixing member 13 to the fifth thickness T5 of the middle delamination film 14 within a manufacturing process error range.

The first spacer 15a according to one embodiment of the present disclosure can be formed of a rigid material or a flexible material (e.g. an elastically deformable material), or the first spacer 15a according to one embodiment of the present disclosure can be formed of the same material as that of the bending panel fixing member 12. The first spacer 15a can compensate for the step difference between the bending panel fixing member 12 and the heat radiation sheet portion 11 by filling up the empty space (or gap space) between the bending panel fixing member 12 and the frame fixing member 13 in the rear surface 11s2 of the heat radiation sheet portion 11.

The second spacer 15b can be disposed to have the second thickness T2 on the rear surface 11s2 of the heat radiation sheet portion 11 while being configured to surround the frame fixing member 13. For example, the second spacer 15b can be disposed in the remaining portions except the bending panel fixing member 12, the frame fixing member 13, and the first spacer 15a in the rear surface 11s2 of the heat radiation sheet portion 11. The second spacer 15b can have the second thickness T2 which is the same as that of the first spacer 15a, and the second spacer 15b can be formed of the same material as that of the first spacer 15a. The second spacer 15b can compensate for the step difference between the frame fixing member 13 and the heat radiation sheet portion 11 in the rear surface 11s2 of the heat radiation sheet portion 11.

The dummy double sided tape 17 is attached to each of the spacer 15 and the middle delamination film 14, and is configured to peel off the spacer 15 from the heat radiation sheet portion 11 or to peel off the middle delamination film 14 from the frame fixing member 13. The dummy double sided tape 17 according to one embodiment of the present disclosure can include a first dummy double sided tape 17a and a second dummy double sided tape 17b.

The first dummy double sided tape 17a can be attached to the rear surface of the first spacer 15a. For example, the first dummy double sided tape 17a has the same two dimensional size or shape as that of the first spacer 15a, and the first dummy double sided tape 17a can be combined with (e.g., bonded to, attached to, etc.) the rear surface of the first spacer 15a.

The first dummy double sided tape 17a according to one embodiment of the present disclosure can have a third thickness T3 corresponding to a value (T1–T2) which is obtained by subtracting the second thickness T2 of the first spacer 15a from the first thickness T1 of the bending panel fixing member 12. Accordingly, a total value (T2+T3) obtained by adding the second thickness T2 of the first spacer 15a and the third thickness T3 of the first dummy double-sided tape 17a can be identical to the first thickness T1 of the bending panel fixing member 12 within a manufacturing process error range. The first dummy double sided tape 17a can compensate for the step difference between the bending panel fixing member 12 and the first spacer 15a, and can peel off the first spacer 15a from the heat radiation sheet portion 11. In this case, an adhesion strength between the first dummy double sided tape 17a and the first spacer 15a is relatively greater than an adhesion strength between the first spacer 15a and the heat radiation sheet portion 11 so that the first dummy double sided tape 17a and the first spacer 15a can be peeled off all together from the heat radiation sheet portion 11. Thus, the first spacer 15a together with the first dummy double sided tape 17a can be peeled off from the heat radiation sheet portion 11.

The second dummy double sided tape 17b can be attached to the rear surface of each of the middle delamination film 14 and the second spacer 15b in common. For example, the second dummy double sided tape 17b has the same two-dimensional size or shape capable of covering all the middle delamination film 14 and the second spacer 15b, and the second dummy double sided tape 17b can be combined with (e.g., bonded to, attached to, etc.) the rear surface of each of the middle delamination film 14 and the second spacer 15b. The second dummy double sided tape 17b has the third thickness T3 which is the same as that of the first dummy double sided tape 17a, and the second dummy double sided tape 17b can be formed of the same material as the first dummy double sided tape 17a. The second dummy double sided tape 17b and the first dummy double sided tape 17a can be positioned on the same plane within a manufacturing process error range.

The second dummy double sided tape 17b can compensate for the step difference between the bending panel fixing member 12 and each of the middle delamination film 14 and the second spacer 15b, can peel off the second spacer 15b from the heat radiation sheet portion 11, and can peel off the middle delamination film 14 from the frame fixing member 13. In this case, in order to peel off the second spacer 15b together with the second dummy double sided tape 17b from the heat radiation sheet portion 11, an adhesion strength between the second dummy double sided tape 17b and the second spacer 15b is relatively greater than an adhesion strength between the second spacer 15b and the heat radiation sheet portion 11, whereby the second spacer 15b and the second dummy double sided tape 17b can be peeled off at the same time. And, in order to peel off the middle delamination film 14 together with the second dummy double sided tape 17b from the frame fixing member 13, an adhesion strength between the second dummy double sided tape 17b and the middle delamination film 14 is relatively greater than an adhesion strength between the frame fixing member 13 and the heat radiation sheet portion 11, whereby the middle delamination film 14 and the second dummy double sided tape 17b can be peeled off at the same time.

The upper delamination film (or upper protection film) 18 can be disposed to cover the entire area of a front surface 11s1 of the heat radiation sheet portion 11. For example, the upper delamination film 18 can be attached to a second surface 11s1 of the adhesion layer 11c included in the heat radiation sheet portion 11. The upper delamination film 18 can protect the front surface of the heat radiation sheet portion 11, and can expose the second surface 11s1 of the adhesion layer 11c included in the heat radiation sheet portion 11. The second surface 11s1 of the adhesion layer 11c exposed by the delamination of the upper delamination film 18 can be combined with (e.g., bonded to, attached to, etc.) the rear surface of the flexible display panel.

Additionally, the upper delamination film 18 can further include at least one upper delamination knob 18a protruding or extending from one side of the upper delamination film 18. The upper delamination knob 18a can serve as a knob configured to peel off the upper delamination film 18 from the heat radiation member 10 of the flexible display.

The lower delamination film (or lower protection film) 19 can be disposed to cover the entire area of the bending panel fixing member 12, the first dummy double sided tape 17a and the second dummy double sided tape 17b. Alternatively, the lower delamination film (or lower protection film) 19 can be disposed to cover less than the entire area of the bending panel fixing member 12, the first dummy double sided tape 17a and the second dummy double sided tape 17b. The lower delamination film 19 can protect the rear surface of the heat radiation sheet portion 11, and can expose each of the bending panel fixing member 12 and the frame fixing member 13 disposed on the heat radiation sheet portion 11.

The lower delamination film 19 according to one embodiment of the present disclosure can include a first lower delamination film 19-1 and a second lower delamination film 19-2.

The first lower delamination film (or first lower protection film) 19-1 can be attached to the bending panel fixing member 12 and the first dummy double sided tape 17a in common. For example, the first lower delamination film (or first lower protection film) 19-1 can be attached to the bending panel fixing member 12 at a first portion of the first lower delamination film and attached the first dummy double sided tape 17a at a second portion of the first lower delamination film. The first portion of the first lower delamination film being different than the second portion of the first lower delamination film. The first lower delamination film 19-1 can protect the bending panel fixing member 12 and the first dummy double sided tape 17a, and can expose the bending panel fixing member 12. Accordingly, the bending panel fixing member 12 can be exposed by the delamination of the first lower delamination film 19-1 for a panel bending process of the flexible display panel, and can be combined with (e.g., bonded to, attached to, etc.) a panel bending portion of the flexible display panel.

An adhesion strength between the bending panel fixing member 12 and the first lower delamination film 19-1 according to one embodiment of the present disclosure can be weaker than an adhesion strength between the heat radiation sheet portion 11 and the bending panel fixing member 12. For example, in order to prevent the bending panel fixing member 12 from being peeled off from the heat radiation sheet portion 11 by the delamination of the first lower delamination film 19-1, the adhesion strength between the heat radiation sheet portion 11 and the bending panel fixing member 12 can be greater than the adhesion strength between the bending panel fixing member 12 and the first lower delamination film 19-1.

An adhesion strength between the first dummy double sided tape 17a and the first lower delamination film 19-1 according to one embodiment of the present disclosure can be greater than an adhesion strength between the heat radiation sheet portion 11 and the first spacer 15a. For example, in order to peel off the first spacer 15a and the first dummy double sided tape 17a from the heat radiation sheet portion 11, at the same time, by the delamination of the first lower delamination film 19-1, the adhesion strength between the heat radiation sheet portion 11 and the first spacer 15a can be weaker than the adhesion strength between the first dummy double sided tape 17a and the first lower delamination film 19-1.

Additionally, the first lower delamination film 19-1 can further include at least one first lower delamination knob 19a protruding or extending from one side of the first lower delamination film 19-1. The first lower delamination knob 19a can serve as a knob configured to peel off the first lower delamination film 19-1 from the heat radiation member for a flexible display.

The second lower delamination film (or second lower protection film) 19-2 can be attached onto the second dummy double sided tape 17b. The second lower delamination film 19-2 can protect the second dummy double sided tape 17b, and can expose the frame fixing member 13. Accordingly, the frame fixing member 13 can be exposed by the delamination of the second dummy double sided tape 17b and the middle delamination film 14 in accordance with the delamination of the second lower delamination film 19-2 for an assembly process of the electronic device, and can be combined with (e.g., bonded to, attached to, etc.) the middle frame of the electronic device.

An adhesion strength between the second dummy double sided tape 17b and the second lower delamination film 19-2 according to one embodiment of the present disclosure can be weaker than an adhesion strength between the heat radiation sheet portion 11 and the frame fixing member 13. For example, in order to prevent the frame fixing member 13 from the heat radiation sheet portion 11 by the delamination of the second lower delamination film 19-2, the adhesion strength between the heat radiation sheet portion 11 and the frame fixing member 13 can be greater than the adhesion strength between the second dummy double sided tape 17b and the second lower delamination film 19-2.

An adhesion strength between the first dummy double sided tape 17a and the second lower delamination film 19-2 according to one embodiment of the present disclosure can be greater than an adhesion strength between the heat radiation sheet portion 11 and the second spacer 15b. For example, in order to peel off the second spacer 15b and the second dummy double sided tape 17b from the heat radiation sheet portion 11, at the same time, by the delamination of the second lower delamination film 19-2, the adhesion strength between the heat radiation sheet portion 11 and the second spacer 15b can be weaker than the adhesion strength between the second dummy double sided tape 17b and the second lower delamination film 19-2.

Additionally, the second lower delamination film 19-2 can further include at least one second lower delamination knob 19c protruding or extending from one side of the second lower delamination film 19-2. The second lower delamination knob 19c can serve as a knob configured to peel off the second lower delamination film 19-2 from the heat radiation member 30 for a flexible display.

Also, the second lower delamination film 19-2 can further include a support wing 19b protruding or extending from the other side of the second lower delamination film 19-2. The support wing 19b temporarily supports the display driving circuit portion connected with the flexible display panel for an assembly process of the display module (unit) so that it is possible to prevent the display driving circuit portion from being bent or broken, and to prevent a physical contact between structures.

Accordingly, the heat radiation member 30 for a flexible display according to the second embodiment of the present disclosure can provide the same effect as that of the heat radiation member 10 for a flexible display according to the first embodiment of the present disclosure. Furthermore, the heat radiation member 30 for a flexible display according to the second embodiment of the present disclosure further includes the frame fixing member 12 additionally disposed in the heat radiation sheet portion 11, so that it is possible to omit the attachment process of the frame fixing member 12 configured to fix the middle frame to the heat radiation sheet portion 11 for an assembly process of the electronic device, and to improve the heat radiation efficiency by transmitting heat of the heat radiation sheet portion 11 to the middle frame.

Figure 5:
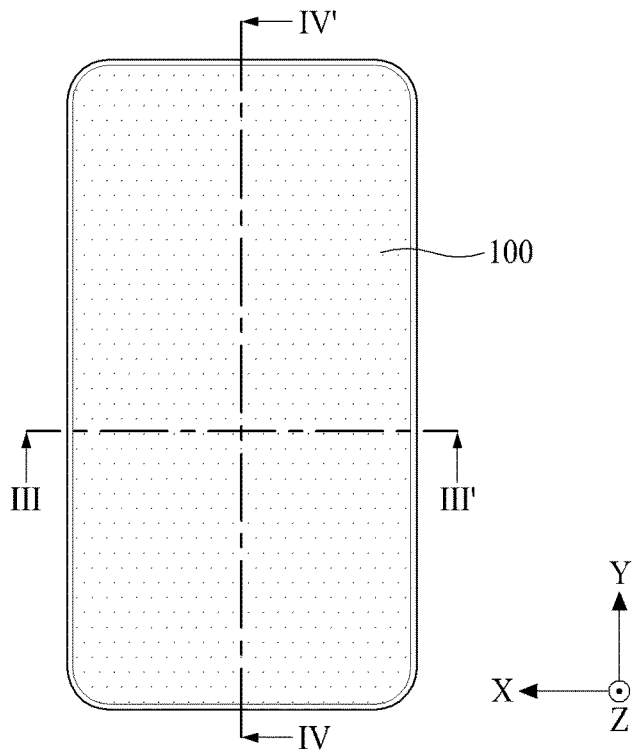
FIG. 5 is a plane view illustrating an electronic device according to one embodiment of the present disclosure.
Figure 6:
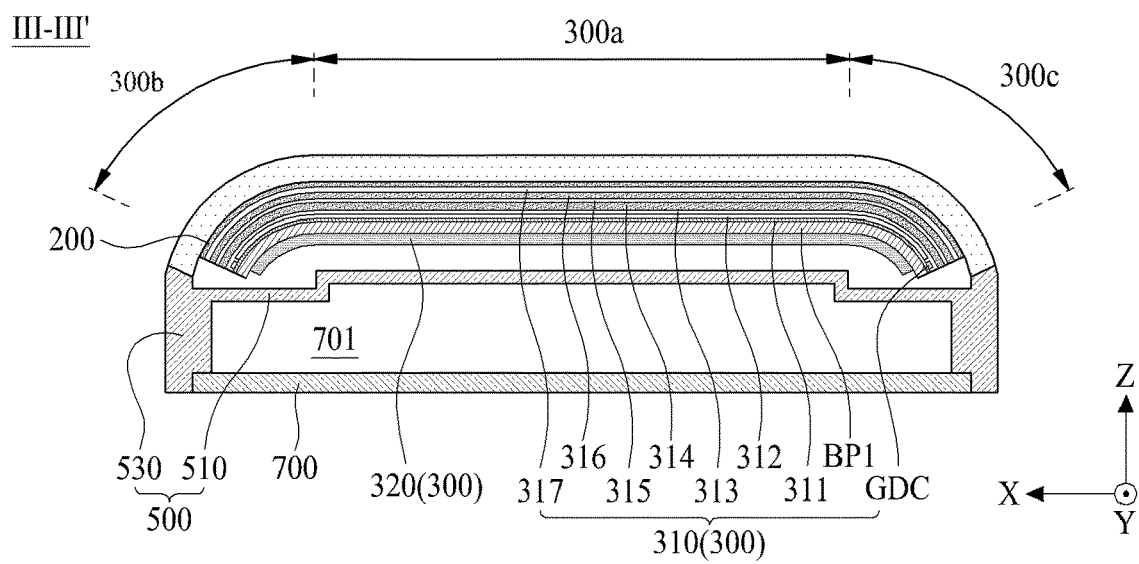
FIG. 6 is a cross-sectional view taken along line III-III' of FIG. 5.
Figure 7:
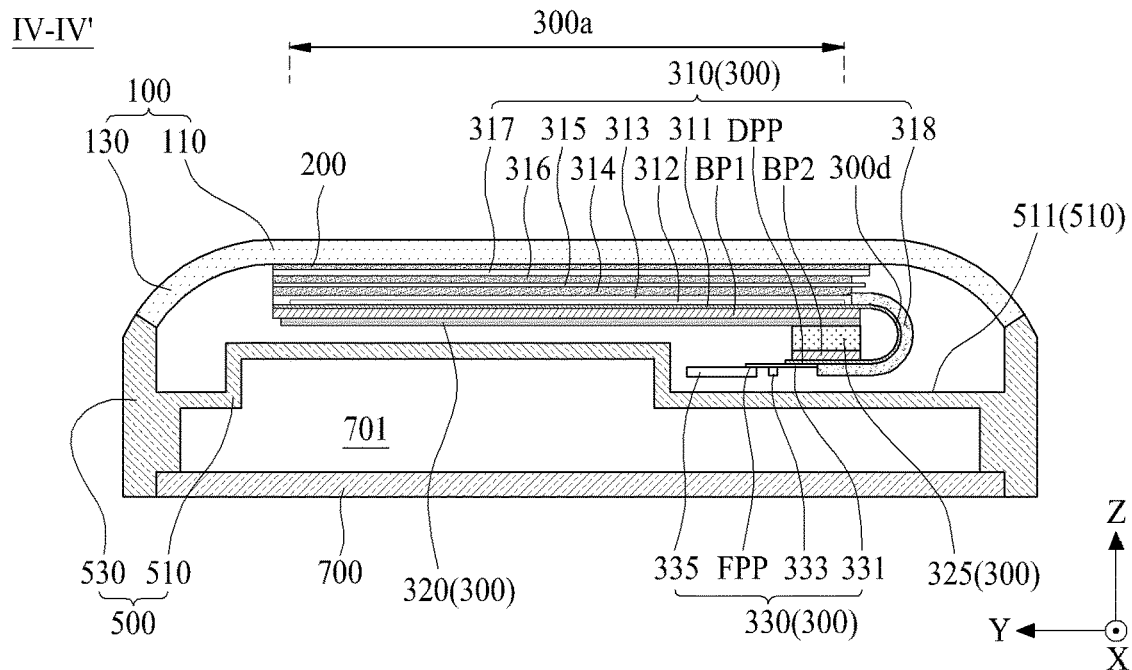
FIG. 7 is a cross-sectional view taken along line IV-IV' of FIG. 5.

FIG. 5 is a plane view illustrating an electronic device according to one embodiment of the present disclosure, FIG. 6 is a cross-sectional view taken along line III-III' of FIG. 5, and FIG. 7 is a cross-sectional view taken along line IV-IV' of FIG. 5, wherein the heat radiation member for a flexible display according to the first embodiment of the present disclosure, shown in FIGS. 1 and 2, is applied to the electronic device shown in FIGS. 5 to 7.

Referring to FIGS. 5 to 7, the electronic device according to one embodiment of the present disclosure can include a cover window 100, a flexible display module 300, and a middle frame 500. Herein, a scale in each of the cover window 100, the flexible display module 300, and the middle frame 500 shown in FIGS. 5 to 7 can be different from a real scale, for convenience of explanation, whereby it is not limited to the scale shown in the drawings.

The cover window 100 covers front and lateral surfaces of the flexible display module 300, whereby the cover window 100 protects the flexible display module 300 from an external shock.

The cover window 100 according to one embodiment of the present disclosure can be formed of a transparent plastic material, a glass material, or a tempered glass material. For example, the cover window 100 can be formed of sapphire glass or gorilla glass, or can be formed in a deposition structure of sapphire glass and gorilla glass™. According to another example, the cover window 100 can include any one material among PET (polyethylene terephthalate), PC (polycarbonate), PES (polyethersulfone), PEN (polyethylene napthalate), and PNB (norbornene). In consideration of scratch and transparency, the cover window 100 can be formed of tempered glass.

The cover window 100 according to one embodiment of the present disclosure can include a front portion 110 and a sidewall portion 130.

The front portion 110 corresponds to a central portion of the cover window 100, wherein the front portion 110 can be a transparent portion through which light passes. The front portion 110 can have a whole flat shape.

The sidewall portion 130 can be bent in a curved-line shape with a predetermined radius of curvature from the edge of the front portion 110. For example, the sidewall portion 130 can include a first sidewall which is bent from the first edge (or left edge) of the front portion 110, a second sidewall which is bent from the second edge (or right edge) of the front portion 110, a third sidewall which is bent from the third edge (or upper edge) of the front portion 110, a fourth sidewall which is bent from the fourth edge (or lower edge) of the front portion 110, and a rounding portion connected between each of the first to fourth sidewalls. Accordingly, each edge of the front portion 110 can have a wholly-curved structure by the sidewall portion 130. The sidewall portion 130 can be expressed as a lateral window or lateral curved window.

According as the cover window 100 has a wholly-curved 4-side bending structure, it is possible to realize a good design in the electronic device, and to reduce a bezel width in each of horizontal and vertical directions of the electronic device.

Additionally, the cover window 100 can further include a design layer (or decoration layer) prepared in the edge. The design layer is printed at least one time on the edge of a rear surface (or back surface) of the cover window 100 confronting the flexible display module 300 so that it is possible to cover a non-display area on which an image is not displayed in the electronic device.

Selectively, the cover window 100 according to one embodiment of the present disclosure can be formed in a plate shape comprising only the front portion 110. In this case, the aforementioned sidewall portion 130 is omitted. For example, the cover window 100 can be provided with only a front portion 110 and can be provided without a sidewall portion 130.

The flexible display module 300 can be a flexible display module of a flat display device. For the following description of the present disclosure, it is assumed that the flexible display module 300 is a flexible light emitting display module. For example, the flexible display module 300 can be elastically deformable, and can have a predetermined elasticity.

The flexible display module 300 is connected with the rear surface (or back surface) of the cover window 100, so that it is possible to display an image and/or to sense a user's touch. The flexible display module 300 can be bonded to a rear surface of the front portion 110 of the cover window 100 by a direct bonding process using a module bonding member 200. Herein, the module bending member 200 can include a pressure sensitive adhesive (PSA), an optically clear adhesive (OCA), or an optically clear resin (OCR). The module bonding member 200 can be expressed as a transparent adhesive member. For example, the module bonding member 200 can be transparent and be comprised of a pressure sensitive adhesive (PSA), an optically clear adhesive (OCA), or an optically clear resin (OCR).

The flexible display module 300 according to one embodiment of the present disclosure can include a display portion 300a, a first bending display portion 300b, and a second bending display portion 300c. The first bending display portion 300b being spaced from the second bending display portion 300c by the display portion 300a.

The display portion 300a enables the display of an image on the front portion 110 of the cover window 100. The first bending display portion 300b, which is bent in a shape of curved surface from the first edge of the display portion 300a, enables display of an image on the curved surface of the first sidewall in the sidewall portion 130 of the cover window 100. The second bending display portion 300c, which is bent in shape of a curved surface from the second edge of the display portion 300a, enables display of an image on the curved surface of the second sidewall in the sidewall portion 130 of the cover window 100. Alternatively, it is possible to omit the first bending display portion 300b and the second bending display portion 300c. In this case, the display portion 300a of the flexible display module 300 is overlapped with the front portion 110 of the cover window 100, however, can be not overlapped with the sidewall portion 130.

The flexible display module 300 according to one embodiment of the present disclosure can include a flexible display panel 310 including the display portion 300a, a panel bending portion 300d and a display pad portion DPP, a heat radiation sheet portion 320 combined with (e.g., bonded to, attached to, etc.) a rear surface (or back surface) of the flexible display panel 310, a bending panel fixing member 325 configured to fix the panel bending portion 300d of the flexible display panel 310 to the heat radiation sheet portion 320, and a display driving circuit portion 330 connected with the display pad portion DPP.

The flexible display panel 310 can be configured to display an image on each of the display portion 300a, the first bending display portion 300b, and the second bending display portion 300c, or can configured to display an image only on the display portion 300a. The flexible display panel 310 according to one embodiment of the present disclosure can include a flexible substrate 311, a pixel array 312, a gate driving circuit GDC, the display pad portion DPP, an encapsulation portion 313, a touch electrode portion 315, a functional film 317, a first back plate BP1 and a second back plate BP2.

The flexible substrate 311 can be defined as a base substrate of the flexible display panel 310. The flexible substrate 311 according to one embodiment of the present disclosure can include a plastic material with flexibility (being elastically deformable), for example, an opaque or colored polyimide (PI). The flexible substrate 311 according to another embodiment of the present disclosure can be formed in a thin film and of a glass material having flexibility (being elastically deformable).

The pixel array 312 according to one embodiment of the present disclosure is formed on the display portion 300a, the first bending display portion 300b and the second bending display portion 300c defined in the flexible substrate 311, whereby an image can be displayed on each of the display portion 300a, the first bending display portion 300b, and the second bending display portion 300c. Further, an image can be displayed on only one of the display portion 300a, the first bending display portion 300b, and the second bending display portion 300c.

The pixel array 312 can include a plurality of pixels which are prepared in a pixel area defined by signal lines on the flexible substrate 311, and the plurality of pixels are configured to display an image in accordance with a signal supplied to the signal lines. The signal lines can include a gate line, a data line, and a pixel driving power source line.

Each of the plurality of pixels can include a pixel circuit layer comprising a driving thin film transistor prepared in the pixel area, an anode electrode electrically connected with the driving thin film transistor, an emission device layer formed on the anode electrode, and a cathode electrode electrically connected with the emission device layer.

The driving thin film transistor is prepared in a transistor area of each pixel area defined on the flexible substrate 311, and the driving thin film transistor can include a gate electrode, a gate insulating film, a semiconductor layer, a source electrode, and a drain electrode. Herein, the semiconductor layer of the thin film transistor can include silicon of a-Si, poly-Si, or low-temperature poly-si, or can include an oxide such as Indium-Gallium-Zinc-Oxide (IGZO).

The anode electrode is prepared as a pattern shape in an opening area defined in each pixel area, and is electrically connected with the driving thin film transistor.

The emission device layer according to one embodiment of the present disclosure can include an organic light emitting device formed on the anode electrode. The organic light emitting device can be configured to emit the same colored light by each pixel, for example, white colored light by each pixel, or can be configured to emit the different colored light by each pixel, for example, red colored light, green colored light, or blue colored light by each pixel.

The emission device layer according to one embodiment of the present disclosure can include a micro light emitting diode device electrically connected with the anode electrode and the cathode electrode. The micro light emitting diode device can be a light emitting diode realized in an integrated circuit or chip, wherein the micro light emitting diode device can include a first terminal electrically connected with the anode electrode, and a second terminal electrically connected with the cathode electrode.

The cathode electrode can be connected with an emission device of the emission device layer prepared for each pixel area in common.

The gate driving circuit portion GDC can be formed in the first edge and/or second edge of the flexible substrate 311 so that the gate driving circuit portion GDC can be connected with one end and/or the other end in each gate signal line prepared on the flexible substrate 311. The gate driving circuit portion GDC can generate a gate signal in response to a gate control signal supplied through the display pad portion DPP, and can supply the generated gate signal to each of the plurality of gate lines. The gate driving circuit portion GDC can be a gate embedded circuit formed from a process of manufacturing the thin film transistor of the pixel, but the date driving circuit portion GDC is not limited to this type of process.

The display pad portion DPP can include a plurality of pad electrodes prepared at one edge (or a non-display area at one side) of the flexible substrate 311 which is apart from one side of the pixel array 312. Each of the plurality of pad electrodes can be electrically connected with the gate driving circuit and the signal line of the pixel array 312 through a link line disposed in a panel bending portion 300d between the display pad portion DPP and one side of the pixel array 312.

The encapsulation portion 313 is formed on the flexible substrate 311 while being configured to surround the pixel array 312 so that it is possible to prevent oxygen or moisture from being permeated into the emission device layer of the pixel array 312. The encapsulation portion 313 according to one embodiment of the present disclosure can be formed in a multi-layered structure obtained by alternately depositing an organic material layer and an inorganic material layer. For example, an organic material layer can be first deposited, followed by an inorganic material layer, and this deposition order can be repeated. Herein, the inorganic material layer prevents oxygen or moisture from being permeated into the emission device layer of the pixel array 312. And, the organic material layer can be formed in a relatively large thickness in comparison to the inorganic material layer so that the organic material layer can cover particles which might be generated for a manufacturing process. For example, the encapsulation portion 313 can include a first inorganic film, an organic film on the first inorganic film, and a second inorganic film on the organic film. In this case, the organic film can be defined as a particle cover layer.

The touch electrode portion 315 is disposed on the encapsulation portion 313, and the touch electrode portion 315 serves as a touch sensor capable of sensing a user's touch on the cover window 100.

The touch electrode portion 315 according to one embodiment of the present disclosure can include a touch electrode layer disposed on the encapsulation portion 313 overlapped with the pixel array 312, and a dielectric layer configured to cover the touch electrode layer. Alternatively, the touch electrode portion 315 can be provided on a touch buffer layer configured to cover the encapsulation portion 313. For example, the touch electrode layer can include a plurality of touch driving electrodes disposed at fixed intervals on the encapsulation portion 313 overlapped with the pixel array 312, and a plurality of touch sensing electrodes electrically insulated from the touch driving electrodes. The touch sensing electrodes can be disposed in the same layer as the touch driving electrodes, or can be displayed in a different layer from the touch driving electrodes with the dielectric layer interposed in-between the touch sensing electrodes and the touch driving electrodes.

The touch electrode portion 315 according to another embodiment of the present disclosure can be substituted by a capacitive touch panel generally known to those in the art. In this case, the touch panel can be attached onto the encapsulation portion 313 by the use of transparent adhesive member 314. Herein, the transparent adhesive member 314 can include a pressure sensitive adhesive (PSA), an optically clear adhesive (OCA), or an optically clear resin (OCR).

The functional film 317 is attached onto the touch electrode portion 315 by the use of film adhesive member 316, and can be attached to the rear surface (or back surface) of the cover window 100 by the use of module bonding member 200. Herein, the film adhesive member 316 can include a pressure sensitive adhesive (PSA), an optically clear adhesive (OCA), or an optically clear resin (OCR).

The functional film 317 according to one embodiment of the present disclosure can include a reflection preventing layer (or reflection preventing film) configured to prevent a reflection of ambient light so as to improve contrast ratio and outdoor visibility for an image displayed on the flexible display panel 310. For example, the reflection preventing layer can include a circular polarizing layer (or circular polarizing film) configured to prevent ambient light being incident through the cover window 100 from being reflected on the thin film transistor, and/or prevent lines from being disposed in the pixel array 312 and from being advanced toward the cover window 100.

The functional film 317 can further include a barrier layer (or barrier film) configured to firstly prevent a permeation of moisture or oxygen, wherein the barrier layer can be formed of a material with low moisture permeation, for example, a polymer material. However, the barrier layer is not limited to a polymer material, and can be any material known to one of ordinary skill in the art to be used as a barrier layer to prevent permeation of moisture or oxygen.

Also, the functional film 317 can further include a light path control layer (or light path control film) configured to control a path of light emitted from the pixel array 312 to the cover window 100. The light path control layer can have a deposition structure obtained by alternately depositing a high refraction layer and a low refraction layer, whereby a path of light being provided from the pixel array 312 can be changed, to thereby minimize a color shift in accordance with a viewing angle.

Alternatively, the functional film 317 can be disposed between the touch electrode portion 315 and the encapsulation portion 313. In this case, the touch electrode portion 315 can be attached to the cover window 100 by the use of module bonding member 200.

The first back plate BP1 is attached to the rear surface (or back surface) of the flexible substrate 311 being overlapped with the pixel array 312, whereby the rear surface (or back surface) of the flexible substrate 311 being overlapped with the pixel array 312 is maintained in a plane state.

The second back plate BP2 is attached to one edge of the rear surface (or back surface) of the flexible substrate 311 being overlapped with the display pad portion DPP, whereby the one edge of the rear surface (or back surface) of the flexible substrate 311 is maintained in a plane state.

A link line area of the flexible substrate 311, which is provided with link lines while being overlapped with an open portion between the first back plate BP1 and the second back plate BP2, can be defined as the panel bending portion 300d which is bent with a predetermined radius of curvature. For example, the panel bending portion 300d of the flexible substrate 311 is not supported in a plane state by the first back plate BP1 and the second back plate BP2, whereby the panel bending portion 300d of the flexible substrate 311 can be freely bent. Accordingly, the panel bending portion 300d of the flexible substrate 311 is bent to surround one lateral surface of the first back plate BP1 confronting the second back plate BP2, whereby the display pad portion DPP can be overlapped with one rear edge of the first back plate BP1. Thus, the flexible display module 300 is bent to provide a predetermined radius of curvature in the panel bending portion 300d of the flexible substrate 311, to thereby realize a small bezel width.

The flexible display panel 310 according to one embodiment of the present disclosure can further include a cover layer (or micro cover layer) 318 for covering the panel bending portion 300d of the flexible substrate 311.

The cover layer 318 can cover the panel bending portion 300d of the flexible substrate 311 disposed between the encapsulation portion 313 and the display pad portion DPP.

The cover layer 318 can include a polymer material, wherein the cover layer 318 can be coated on to the panel bending portion 300d of the flexible substrate 311 so as to cover the link line between the encapsulation portion 313 and the display pad portion DPP. The cover layer 318 protects the link line from an external shock, and also prevents a moisture permeation into the link line. Especially, when the panel bending portion 300d of the flexible substrate 311 is bent in a curved-line shape with a predetermined radius of curvature, the cover layer 318 is provided to position the link line on a neutral plane. For example, when the panel bending portion 300d of the flexible substrate 311 is bent with a predetermined radius of curvature, the neutral plane, in which each of a tensile force and a compressive force becomes '0' (zero), exists between the flexible substrate 311 and the cover layer 318. Accordingly, the cover layer 318 can include a material whose elastic coefficient is relatively higher than that of the flexible substrate 311 so that the link lines can be positioned in the neutral plane. Thus, the link lines are positioned in the neutral plane between the cover layer 318 and the flexible substrate 311. For example, when the panel bending portion 300d of the flexible substrate 311 is bent in a curved-line shape, a bending stress of '0' is applied to the link lines positioned in the neutral line between the cover layer 318 and the flexible substrate 311, whereby the link lines can be bent without any damage caused by the bending stress.

The heat radiation sheet portion 320 can be attached to the entire area of the rear surface (or back surface) of the first back plate BP1. The heat radiation sheet portion 320 can protect the flexible display panel 310 from a shock, and can radiate heat of the flexible display panel 310. The heat radiation sheet portion 320 according to one embodiment of the present disclosure can be formed of the heat radiation sheet portion 11 included in the heat radiation member 10 for a flexible display according to the first embodiment of the present disclosure shown in FIGS. 1 and 2. For example, the heat radiation sheet portion 320 can include a heat radiation sheet 11a, a cushion sheet 11b and an adhesion layer 11c, shown in FIGS. 1 and 2, whereby a detailed repetitive description for the heat radiation sheet 11a, the cushion sheet 11b and the adhesion layer 11c will be omitted.

The bending panel fixing member (or first fixing member) 325 can be disposed between the heat radiation sheet portion 320 and the second back plate BP2 being overlapped with each other with respect to a thickness direction Z of the flexible display panel 310. The bending panel fixing member 325 fixes the second back plate BP2 overlapped with the rear surface of the first back plate BP1 to one edge of the heat radiation sheet portion 320 in accordance with the bending of the flexible substrate 311 so that it is possible to maintain the bending state and bending shape of the flexible substrate 311. In this case, the heat radiation sheet portion 320 according to the present disclosure covers the entire area of the rear surface of the second back plate BP2, and the bending panel fixing member 325 is disposed on one edge of the heat radiation sheet portion 320 so that a gap space is not formed between the heat radiation sheet portion 320 and the bending panel fixing member 325, to thereby prevent a light leakage in the rear surface of the flexible display panel. Also, according as the bending panel fixing member 325 according to the present disclosure is directly attached to the heat radiation sheet portion 320 without being directly attached to the rear surface of the first back plate BP1, a distance between the first back plate BP1 and the second back plate BP2 is increased so that it is possible to reduce a bending repulsive force by the panel bending portion 300d of the flexible substrate 311 which is bent in a curved-line shape. For example, the bending panel fixing member 325 can be attached to a rear surface of the heat radiation sheet portion 320, and the front surface of the heat radiation sheet portion 320 can be attached to the rear surface of the first back plate BP1, such that the bending panel fixing member 325 is spaced from the first back plate BP1.

The bending panel fixing member 325 according to one embodiment of the present disclosure is formed of the bending panel fixing member 12 of the heat radiation member 10 for a flexible display, shown in FIGS. 1 and 2, according to the first embodiment of the present disclosure, whereby a detailed description for the bending panel fixing member 325 will be omitted. The bending panel fixing member 325 is integrated with the heat radiation sheet portion 320, whereby the bending panel fixing member 325 together with the heat radiation sheet portion 320 can be disposed in the rear surface of the flexible display panel 310.

The display driving circuit portion 330 is connected with the display pad portion DPP of the flexible display panel 310, and can be disposed in the rear surface of the flexible display panel 310. The display driving circuit portion 330 displays an image on the pixel array 312 of the flexible display panel 310, and senses a user's touch through the touch electrode portion 315 of the flexible display panel 310.

The display driving circuit portion 330 according to one embodiment of the present disclosure can include a flexible circuit film 331, a driving integrated circuit 333, and a flexible circuit board 335.

The flexible circuit film 331 can be electrically connected with the display pad portion DPP prepared in the flexible substrate 311 while being disposed in the rear surface of the flexible display panel 310. The flexible circuit film 331 according to one embodiment of the present disclosure can be attached to the display pad portion DPP prepared in the flexible substrate 311 through the use of a film attachment process using an anisotropic conductive film. For example, the flexible circuit film 331 can be a chip disposed on a film.

The driving integrated circuit 333 can be mounted on the flexible circuit film 310 disposed in the rear surface of the flexible display panel 310. The driving integrated circuit 333 according to one embodiment of the present disclosure can be mounted on the flexible circuit film 331 by a chip bonding process or a surface mounting process. For example, the driving integrated circuit 333 can be mounted on the flexible circuit film 331 disposed between the display pad portion DPP and the flexible circuit board 335.

The driving integrated circuit 333 according to one embodiment of the present disclosure can generate a data signal and a gate control signal on the basis of a timing synchronized signal and video data supplied from an external host driving system (or host driving circuit board), can supply the data signal to the data line of each pixel through the display pad portion DPP, and can supply the gate control signal to the gate driving circuit portion. The driving integrated circuit 333 according to one embodiment of the present disclosure can be overlapped with the bending panel fixing member 325. In this case, the bending panel fixing member 325 can be formed of a double sided conductive tape and can be integrated with the heat radiation sheet portion 320 while being configured to have the size overlapped with the driving integrated circuit 333, whereby the heat generated in the driving integrated circuit 333 can be radiated to the heat radiation sheet portion 320 through the use of bending panel fixing member 325.

Alternatively, the driving integrated circuit 333 is not mounted on the flexible circuit film 331, and is mounted (or bonded) onto a chip mounting area defined in the flexible substrate 311, whereby the driving integrated circuit 333 can be electrically connected with the display pad portion DPP, and can be connected with each of the signal line of the pixel array 312 and the gate driving circuit portion disposed on the flexible substrate 311. In this case, the flexible circuit film 331 can relay a signal transport between the display pad portion DPP and the host driving system, or can be omitted.

The flexible circuit board 335 can be electrically connected with the flexible circuit film 331 in the rear surface of the flexible display panel 310. The flexible circuit board 335 according to one embodiment of the present disclosure can be electrically connected with a film pad portion FPP prepared in the flexible circuit film 331 by a film attachment process using an anisotropic conductive film, and can be overlapped with the first back plate BP1 of the flexible display panel 310. The flexible circuit board 335 can provide the timing synchronized signal and video data, supplied from the host driving system, to the driving integrated circuit 333 through the display pad portion DPP, and can provide voltages which are necessary for driving the pixel array 312, the gate driving circuit, and the driving integrated circuit 333. The flexible circuit board 335 can be expressed as a main flexible printed circuit board or a display driving circuit board.

The middle frame 500 can support the cover window 100, and can cover the rear surface of the flexible display module 300. The middle frame 500 is disposed in the outermost surface of the electronic device, and the middle frame 500 can include a metal material having a color coating layer. The middle frame 500 according to one embodiment of the present disclosure can be formed of a metal material with a relatively high thermal conductivity so as to improve a heat radiation efficiency of the electronic device, for example, an aluminum material.

The middle frame 500 according to one embodiment of the present disclosure can include a middle plate 510 and a middle sidewall 530.

The middle plate 510 can be provided to cover the rear surface of the flexible display module 300. In this case, the middle plate 510 can include at least one open portion through which a cable for an electrical connection between the host driving system and the display driving circuit portion 330 passes, and at least one groove portion in which various electronic circuit components mounted on the electronic device are disposed. For example, the middle plate 510 can include a circuit disposition groove 511 configured to dispose the display driving circuit portion 330 disposed in one rear edge of the flexible display panel 310.

The middle sidewall 530, which is vertically combined with (e.g., bonded to, attached to, etc.) a lateral surface of the middle plate 510, can support the sidewall portion 130 of the cover window 100. For example, the middle sidewall 530 can be combined with (e.g., bonded to, attached to, etc.) the sidewall portion 130 of the cover window 100 by the use of double sided tape or waterproof tape. In this case, it is possible to improve a waterproof efficiency of the electronic device and to prevent a permeation of foreign matters.

The electronic device according to one embodiment of the present disclosure can further include a back cover 700 configured to cover the rear surface (or back surface) of the middle frame 500.

The back cover 700 is combined with (e.g., bonded to, attached to, etc.) the middle sidewall 530 while being configured to confront the rear surface of the middle plate 510, whereby the back cover 700 covers the rear surface (or back surface) of the middle frame 500 and prepares a circuit receiving space 701 in the rear surface of the middle frame 500. The circuit receiving space 701 is prepared between the middle plate 510 of the middle frame 500 and the back cover 700, wherein a host driving system, a memory and a battery can be received in the circuit receiving space 701. The back cover 700 can be detachably combined with (e.g., bonded to, attached to, etc.) the middle sidewall 530 in case of a battery replacement by a battery depletion for the use of the electronic device, or can be combined with (e.g., bonded to, attached to, etc.) the middle sidewall 530 and be capable of being detached only in case of a disassemble for a repair of the electronic device. The back cover 700 is disposed in the outermost rear surface of the electronic device, and the back cover 700 can include a plastic material, a metal material or a glass material. For example, the back cover 700 can include a glass material with a color coating layer.

Accordingly, the electronic device according to one embodiment of the present disclosure includes the bending panel fixing member 325 and the heat radiation sheet portion 320 in accordance with the heat radiation member 10 for a flexible display, shown in FIGS. 1 and 2, according to the first embodiment of the present disclosure. Thus, the bending panel fixing member 325 together with the heat radiation sheet portion 320 is disposed in the rear surface of the flexible display panel 310, so that it is possible to simplify a manufacturing process and to reduce a process tact time.

Figure 8:
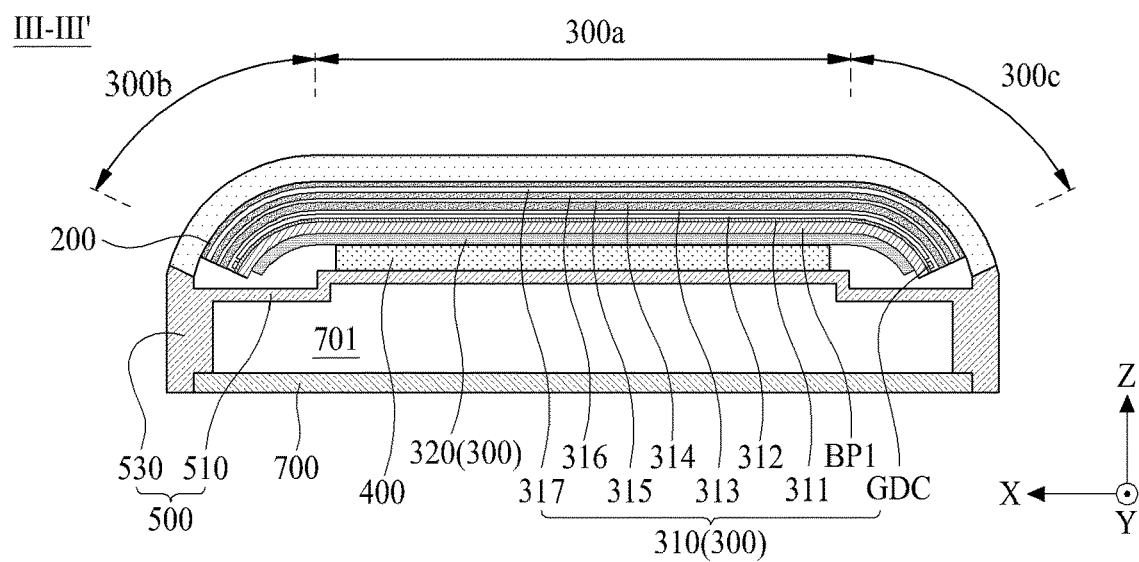
FIG. 8 is another cross-sectional view taken along line III-III' of FIG. 5.
Figure 9:
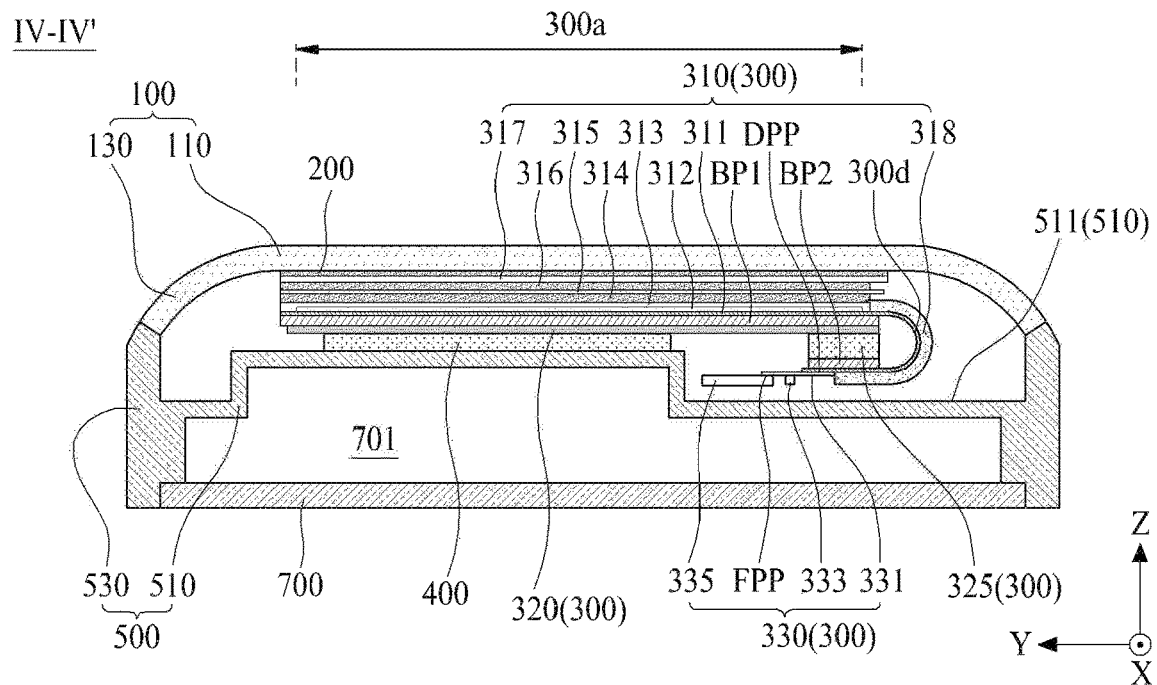
FIG. 9 is another cross-sectional view taken along line IV-IV' of FIG. 5.

FIG. 8 is another cross-sectional view taken along line III-III' of FIG. 5, and FIG. 9 is another cross-sectional view taken along line IV-IV' of FIG. 5, which show the heat radiation member for a flexible display, shown in FIGS. 3 and 4, according to the second embodiment of the present disclosure.

Referring to FIGS. 8 and 9, the electronic device according to another embodiment of the present disclosure can include a cover window 100, a flexible display module 300, a middle frame 500, and a frame fixing member 400. Except the frame fixing member 400, the remaining elements of the electronic device are identical to those of the electronic device shown in FIGS. 6 and 7, whereby the same reference numerals are used throughout the drawings to refer to the same parts, and a detailed repetitive description for the same parts will be omitted.

The frame fixing member (or second fixing member) 400 can be interposed between the flexible display module 300 and the middle frame 500. For example, one surface of the frame fixing member 400 can be attached (or combined) to the flexible display module 300, for example, a heat radiation sheet of a heat radiation sheet portion 320, and the other surface of the frame fixing member 400 can be attached (or combined) to a middle plate 510 of the middle frame 500.

The frame fixing member 400 according to one embodiment of the present disclosure can be formed of the frame fixing member 13 of the heat radiation member 30 for a flexible display, shown in FIGS. 3 and 4, according to the second embodiment of the present disclosure, whereby a detailed description for the frame fixing member 400 will be omitted. The frame fixing member 400 is integrated with the heat radiation sheet portion 320, whereby the frame fixing member 400 together with the heat radiation sheet portion 320 can be disposed in the rear surface of the flexible display panel 310.

The frame fixing member 400 according to the present disclosure can include a conductive plate, a first conductive adhesion layer formed in a front surface of the conductive plate and adhered to the heat radiation sheet portion 320, and a second conductive adhesion layer formed in a rear surface of the conductive plate and adhered to a middle plate 510 of the middle frame 500. In this case, the middle frame 500 can be formed of a metal material with a relatively high thermal conductivity so as to improve a heat radiation efficiency of the electronic device, for example, an aluminum material. However, any other material having a relatively high thermal conductivity known to one of ordinary skill in the art may be used for the middle frame 500.

Accordingly, the frame fixing member 400 fixes the flexible display module 300 to the middle frame 500, and transmits heat of the heat radiation sheet portion 320 to the middle frame 500 so as to radiate the heat, to thereby improve a heat radiation efficiency of the electronic device.

Accordingly, the electronic device according to another embodiment of the present disclosure includes the bending panel fixing member 325 and the frame fixing member 400 in accordance with the heat radiation member 30 for a flexible display, shown in FIGS. 3 and 4, according to the second embodiment of the present disclosure. Thus, the frame fixing member 400 and the bending panel fixing member 325 together with the heat radiation sheet portion 320 can be disposed in the rear surface of the flexible display panel 310 so that it is possible to simplify a manufacturing process and to reduce a process tact time. Also, a heat radiation efficiency can be improved more by additionally providing a heat radiation function of the middle frame 500 so as to radiate heat of the heat radiation sheet portion 320, which is transmitted through the frame fixing member 400, in addition to a heat radiation function of the heat radiation sheet portion 320.

FIGS. 10A to 10D illustrate a method for manufacturing the electronic device according to one embodiment of the present disclosure, which show the method for manufacturing the electronic device using the heat radiation member for a flexible display according to the first embodiment of the present disclosure.

The method for manufacturing the electronic device according to one embodiment of the present disclosure will be described with reference to FIGS. 10A to 10D.

Figure 10A:
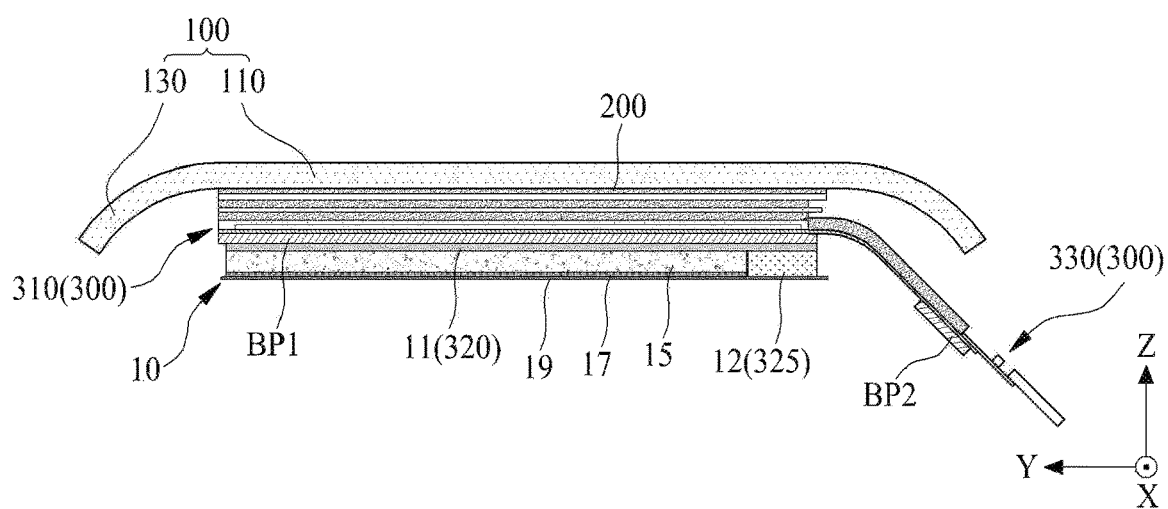
FIGS. 10A to 10D illustrate a method for manufacturing an electronic device according to one embodiment of the present disclosure.

First, as shown in FIG. 10A, the flexible display module 300 can be pre-attached (or pre-bonded) to the front portion 110 of the cover window 100 by the use of module bonding member 200. Further, the upper delamination film 18 is peeled off from the heat radiation member 10 for a flexible display shown in FIGS. 1 and 2, and then the heat radiation sheet portion 11 can be pre-bonded to the rear surface of the flexible display panel 310. In this case, the rear surface of the heat radiation member 10 for a flexible display can be covered and protected by the lower delamination film 19. Alternatively, after the heat radiation member 10 for a flexible display is pre-bonded to the rear surface of the flexible display panel 310, the flexible display module 310 with the heat radiation member 10 for a flexible display pre-bonded thereto can be pre-bonded to the front portion 110 of the cover window 100 by the use of module bending member 20.

Figure 10B:
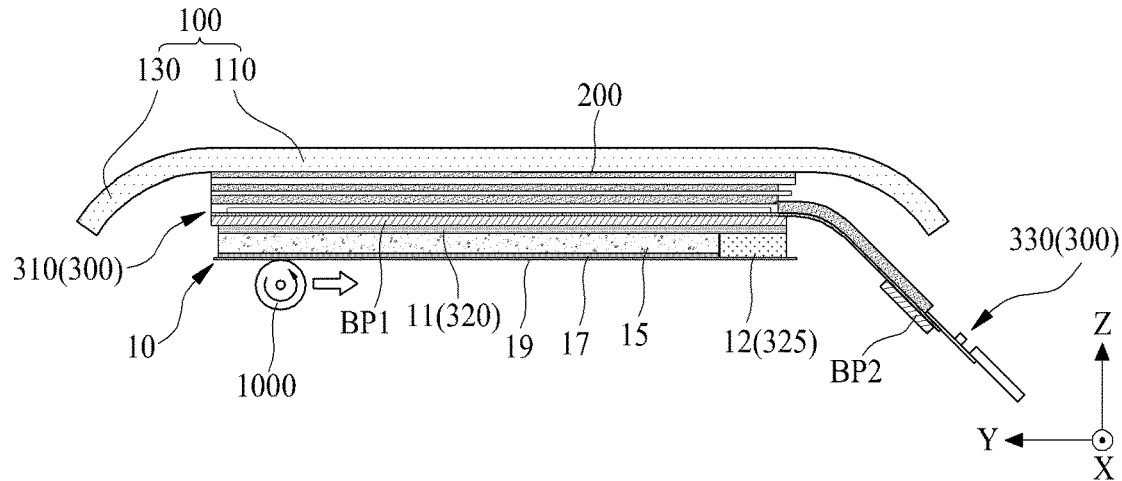

Then, as shown in FIG. 10B, the heat radiation sheet portion 11 of the heat radiation member 10 for a flexible display is combined with (e.g., bonded to, attached to, etc.) the rear surface of the flexible display panel 310, and the flexible display module 300 is combined with (e.g., bonded to, attached to, etc.) the cover window 100, at the same time, by a direct laminating process using a roller 1000. In this case, the rear surface of the heat radiation member 10 for a flexible display is maintained in the plane state under the circumstances that there is no step difference between the bending panel fixing member 12 and the heat radiation sheet portion 11 by the use of dummy double sided tape 17. Thus, the non-adhesion area caused by the step difference between the heat radiation sheet portion 11 and the bending panel fixing member 12 is not generated for the direct laminating process using the roller 1000.

Figure 10C:
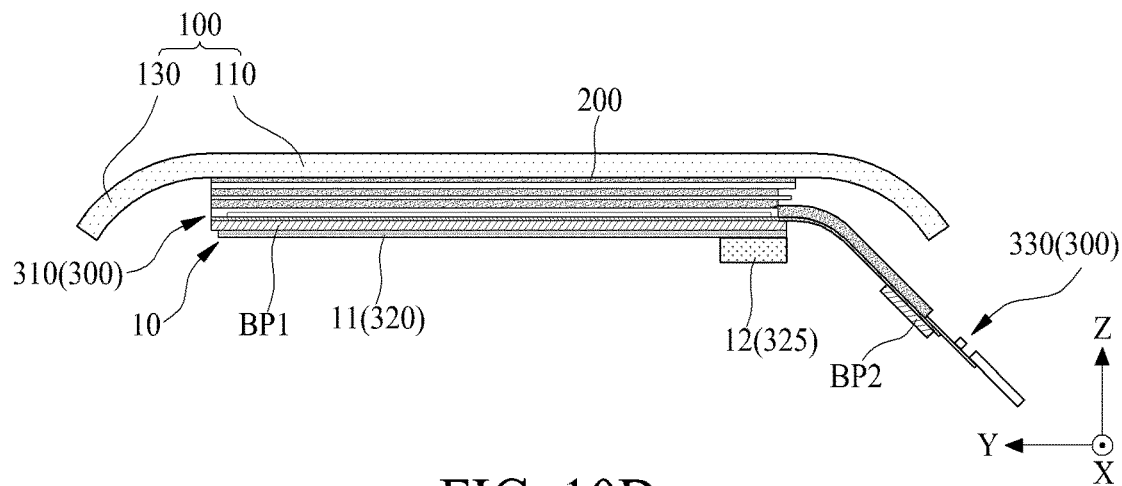

Then, after completion of the direct laminating process, the lower delamination film 19 is peeled off from the heat radiation member 10 for a flexible display by the delamination process of the lower delamination film 19, whereby it is possible to expose the rear surface in each of the bending panel fixing member 12 and the heat radiation sheet portion 11 disposed in one edge of the heat radiation sheet portion 11, as shown in FIG. 10C. In this case, the dummy double sided tape 17 and the spacer 15 disposed in the heat radiation sheet portion 11 can be peeled off together with the delamination of the lower delamination film 19.

Figure 10D:
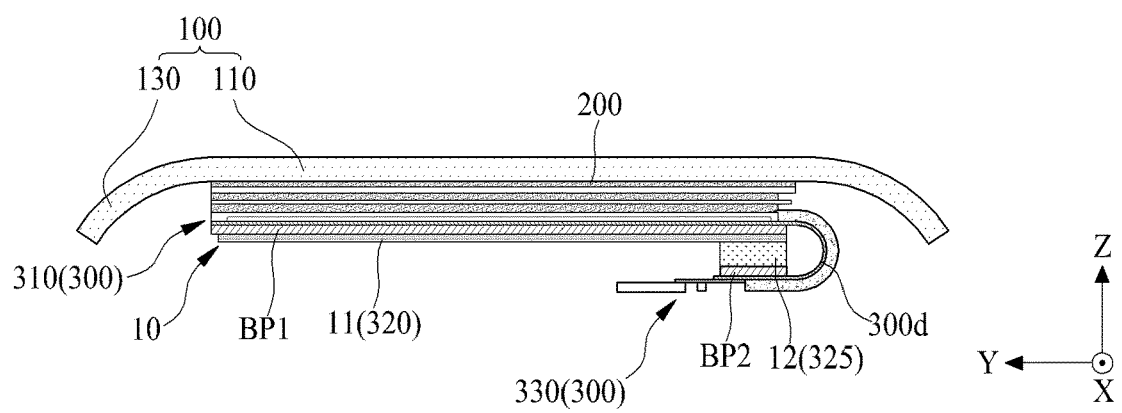

Then, as shown in FIG. 10D, the panel bending portion 300d of the flexible display panel 310 is bent by the panel bending process of the flexible display panel 310 so that the second back plate BP2 disposed in the panel bending portion 300d is combined with (e.g., bonded to, attached to, etc.) the bending panel fixing member 12. Thus, according as the second back plate BP2 of the flexible display panel 310 is fixed to the bending panel fixing member 12, the panel bending portion 300d of the flexible display panel 310 can be bent in a curved-line shape and be maintained (or fixed) in the bent state. For example, the panel bending portion 300d of the flexible display panel 310 can have a curved shape.

In the method for manufacturing the electronic device according to one embodiment of the present disclosure, the attachment process of the heat radiation sheet portion 11 and the attachment process of the bending panel fixing member 12 can be carried out at the same time so that it is possible to simplify the manufacturing process and to reduce the process tact time. Also, the entire surface of the flexible display panel 310 and the entire surface of the heat radiation sheet portion 11 can be uniformly adhered to each other without any non-adhesion area (or non-compressed area) caused by the step difference between the heat radiation sheet portion 11 and the bending panel fixing member 12.

FIGS. 11A to 11F illustrate a method for manufacturing the electronic device according to another embodiment of the present disclosure, which show the method for manufacturing the electronic device using the heat radiation member for a flexible display according to the second embodiment of the present disclosure.

The method for manufacturing the electronic device according to another embodiment of the present disclosure will be described with reference to FIGS. 11A to 11F.

Figure 11A:
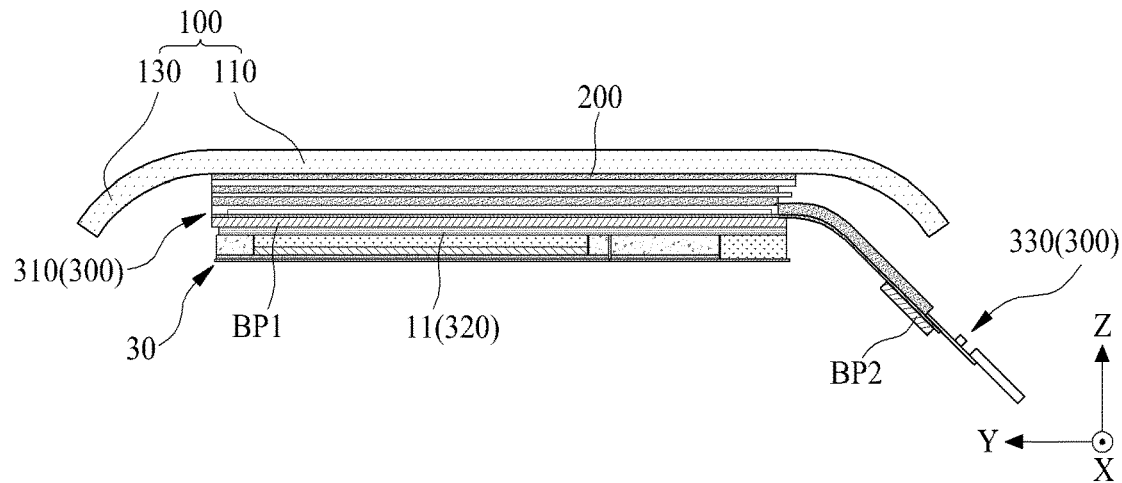
FIGS. 11A to 11F illustrate a method for manufacturing an electronic device according to another embodiment of the present disclosure.

First, as shown in FIG. 11A, the flexible display module 300 can be pre-attached (or pre-bonded) to the front portion 110 of the cover window 100 by the use of module bonding member 200. And, the upper delamination film 18 is peeled off from the heat radiation member 30 for a flexible display shown in FIGS. 3 and 4, and then the heat radiation sheet portion 11 can be pre-bonded to the rear surface of the flexible display panel 310. In this case, the rear surface of the heat radiation member 30 for a flexible display can be covered and protected by the lower delamination film 19. Alternatively, after the heat radiation member 30 for a flexible display is pre-bonded to the rear surface of the flexible display panel 310, the flexible display panel 310 with the heat radiation member 30 for a flexible display pre-bonded thereto can be pre-bonded to the front portion 110 of the cover window 100 by the use of a module bonding member 200.

Figure 11B:
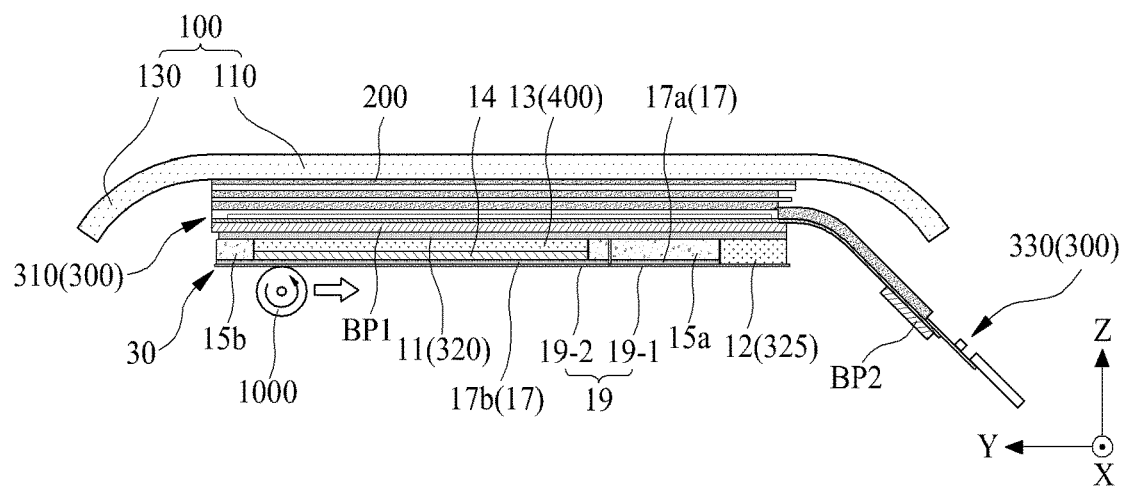

Then, as shown in FIG. 11B, the heat radiation sheet portion 11 of the heat radiation member 30 for a flexible display is combined with (e.g., bonded to, attached to, etc.) the rear surface of the flexible display panel 310, and the flexible display module 300 is combined with (e.g., bonded to, attached to, etc.) the cover window 100, at the same time, by a direct laminating process using a roller 1000. In this case, the rear surface of the heat radiation member 30 for a flexible display is maintained in the plane state under the circumstances that there is no step difference between the bending panel fixing member 12 and the heat radiation sheet portion 11 by the use of the frame fixing member 13, first and second spacers 15a and 15b, middle delamination film 14, and first and second dummy double sided tapes 17a and 17b. Thus, the non-adhesion area caused by the step difference between the heat radiation sheet portion 11 and the bending panel fixing member 12 is not generated for the direct laminating process using the roller 1000.

Figure 11C:
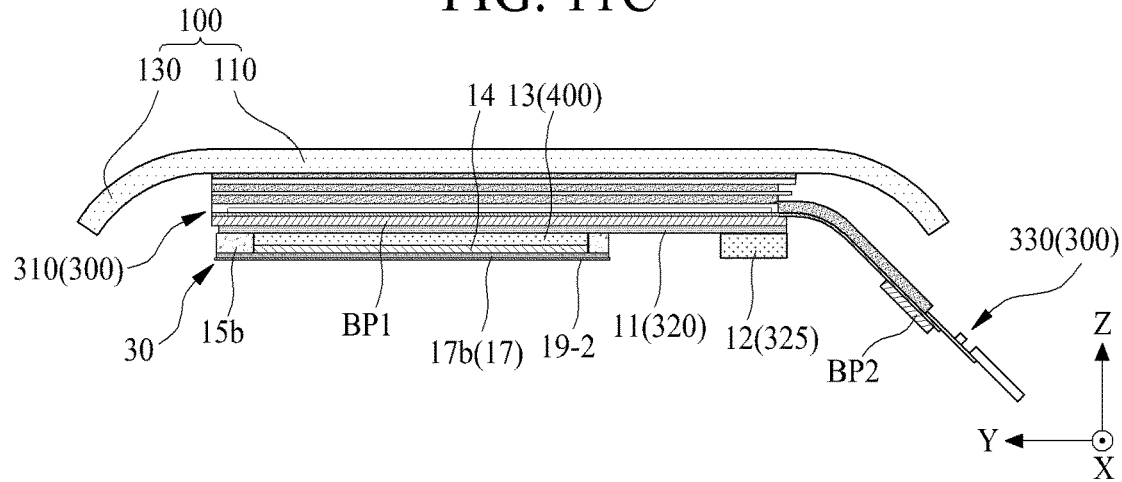

Then, after completion of the direct laminating process, the first lower delamination film 19-1 is peeled off from the heat radiation member 30 for a flexible display by the delamination process of the first lower delamination film 19-1 of the lower delamination film 19, whereby the bending panel fixing member 12 disposed in one edge of the heat radiation sheet portion 11 is exposed, as shown in FIG. 11C. In this case, the first dummy double sided tape 17a and the first spacer 15a disposed in the heat radiation sheet portion 11 can be peeled off together with the delamination of the first lower delamination film 19-1. On the other hand, the frame fixing member 13, the second spacer 15b, the middle delamination film 14 and the second dummy double sided tape 17b disposed in the heat radiation sheet portion 11 are not exposed while being covered by the second lower delamination film 19-2 of the lower delamination film 19.

Figure 11D:
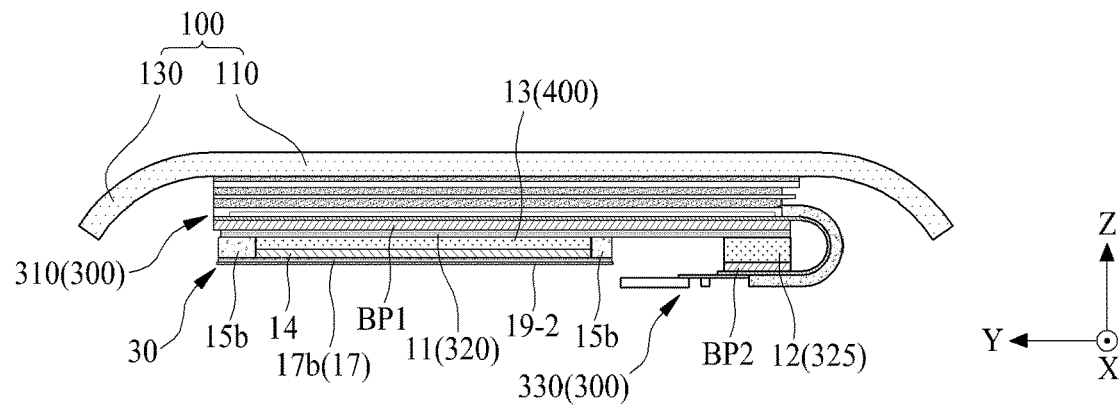

Then, as shown in FIG. 11D, the panel bending portion 300d of the flexible display panel 310 is bent by the panel bending process of the flexible display panel 310 so that the second back plate BP2 disposed in the panel bending portion 300d is combined with (e.g., bonded to, attached to, etc.) the bending panel fixing member 12. Thus, according as the second back plate BP2 of the flexible display panel 310 is fixed to the bending panel fixing member 12, the panel bending portion 300d of the flexible display panel 310 can be bent in a curved-line shape (e.g. have a curved shape) and be maintained (or fixed) in the bent state.

Figure 11E:
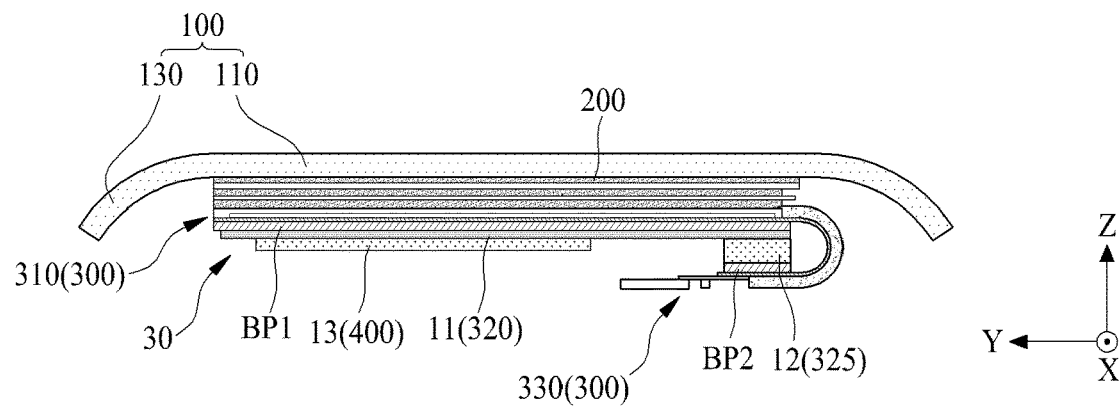
Figure 11F:
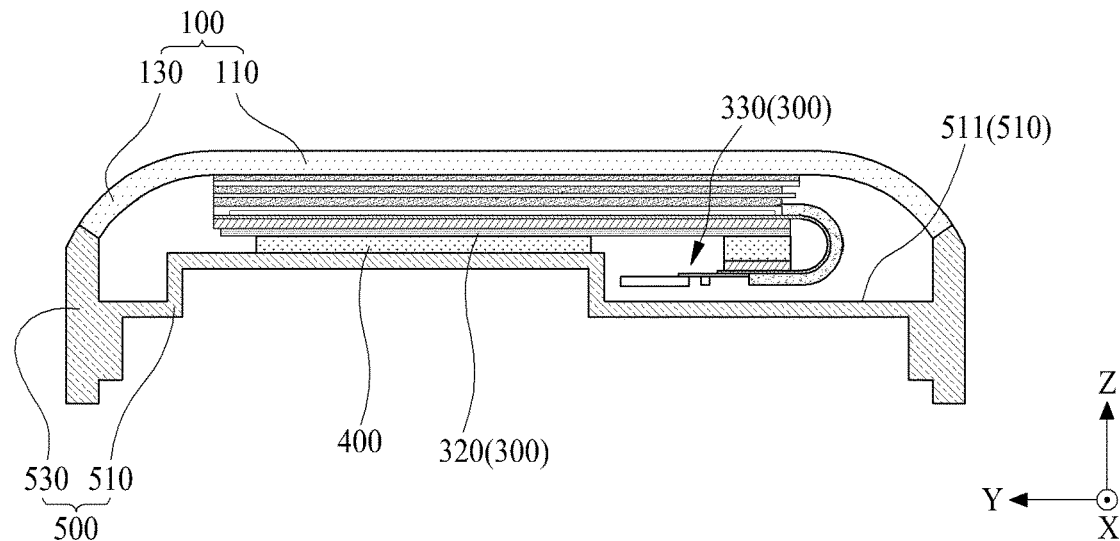

Then, after completion of the panel bending process of the flexible display panel 310, the second lower delamination film 19-2 is additionally peeled off from the heat radiation member 30 for a flexible display for the delamination process of the second lower delamination film 19-2 of the lower delamination film 19, whereby the frame fixing member 13 disposed in the heat radiation sheet portion 11 is exposed, as shown in FIG. 11E. In this case, the middle delamination film 14, the second dummy double sided tape 17b and the second spacer 15b disposed in the heat radiation sheet portion 11 can be peeled off together with the delamination of the second lower delamination film 19-2. For example, after the second lower delamination film 19-2 is additionally peeled off from the heat radiation member 30, together with the middle delamination film 14, the second dummy double sided tape 17b and the second spacer 15b, the frame fixing member 400 can remain.

Then, according as the middle frame 500 is fixed to the frame fixing member 400 with the heat radiation sheet portion 320 of the flexible display module 300, which is attached thereto for the module assembly process, the rear surface of the flexible display module 300 is covered by the middle frame 500. In this case, the middle plate 510 of the middle frame 500 can be fixed to the rear surface of the flexible display module 300, for example, the heat radiation sheet portion 320 by the use of frame fixing member 400. And, the middle sidewall 530 of the middle frame 500 can be combined with (e.g., bonded to, attached to, etc.) the sidewall portion 130 of the cover window 100 by the use of a double sided tape. Also, the display driving circuit portion 330 can be inserted into and disposed in the circuit disposition groove 511 prepared in the middle plate 510.

Then, after the circuits of the host driving system, memory and battery can be disposed in the rear surface of the middle plate 510, and the back cover is combined with (e.g., bonded to, attached to, etc.) the middle frame 500, to thereby cover the rear surface of the middle frame 500.

In the method for manufacturing the electronic device according to another embodiment of the present disclosure, the attachment process of the heat radiation sheet portion 11, the attachment process of the bending panel fixing member 12 and the attachment process of the frame fixing member 13 can be carried out at the same time so that it is possible to simplify the manufacturing process and to reduce the process tact time. Also, the entire surface of the flexible display panel 310 and the entire surface of the heat radiation sheet portion 11 can be uniformly adhered to each other without any non-adhesion area (or non-compressed area) caused by the step difference between the heat radiation sheet portion 11 and the bending panel fixing member 12.

The heat radiation member for a flexible display according to one embodiment of the present disclosure is described as follows.

According to an embodiment of the present disclosure, a heat radiation member for a flexible display comprises a heat radiation sheet portion including a metal layer; a bending panel fixing member attached to a first area in the one surface of the heat radiation sheet portion; a spacer attached to a second area in one surface of the heat radiation sheet portion; a dummy double sided tape combined with (e.g., bonded to, attached to, etc.) the spacer; an upper delamination film configured to cover an entire area of the other surface of the heat radiation sheet portion; and a lower delamination film configured to cover an entire area of the dummy double sided tape and an entire area of the bending panel fixing member.

According to one or more embodiments of the present disclosure, a total thickness of the spacer and the dummy double sided tape may be identical to a thickness of the bending panel fixing member.

According to one or more embodiments of the present disclosure, an adhesion strength between the dummy double sided tape and the spacer may be relatively higher than an adhesion strength between the heat radiation sheet portion and the spacer.

According to one or more embodiments of the present disclosure, an adhesion strength between the lower delamination film and the bending panel fixing member may be relatively lower than an adhesion strength between the heat radiation sheet portion and the bending panel fixing member, and an adhesion strength between the lower delamination film and the dummy double sided tape may be relatively higher than an adhesion strength between the heat radiation sheet portion and the spacer.

According to one or more embodiments of the present disclosure, the spacer can be formed of the same material as that of the bending panel fixing member.

According to one or more embodiments of the present disclosure, the heat radiation member can further include a frame fixing member attached to a third area between the first and second areas of the heat radiation sheet portion; and a middle delamination film attached to the frame fixing member, wherein the spacer can include a first spacer disposed between the bending panel fixing member and the frame fixing member, and a first spacer configured to surround the frame fixing member, the dummy double sided tape can include a first dummy double sided tape attached to the first spacer, and a second dummy double sided tape attached to the second spacer and the middle delamination film, and the lower delamination film can include a first lower delamination film configured to cover the first dummy double sided tape and the bending panel fixing member, and a second lower delamination film configured to cover the second dummy double sided tape.

According to one or more embodiments of the present disclosure, a total thickness of the spacer and the dummy double sided tape can be identical to a thickness of the bending panel fixing member, and a total thickness of the frame fixing member, the middle delamination film and the second dummy double sided tape can be identical to the thickness of the bending panel fixing member.

According to one or more embodiments of the present disclosure, an adhesion strength between the dummy double sided tape and the spacer can be relatively higher than an adhesion strength between the heat radiation sheet portion and the spacer.

According to one or more embodiments of the present disclosure, an adhesion strength between the lower delamination film and the dummy double sided tape can be relatively greater than an adhesion strength between the heat radiation sheet portion and the spacer, and an adhesion strength between the first lower delamination film and the bending panel fixing member can be relatively lower than an adhesion strength between the heat radiation sheet portion and the bending panel fixing member.

According to one or more embodiments of the present disclosure, the spacer can be formed of the same material as that of the bending panel fixing member.

According to one or more embodiments of the present disclosure, the frame fixing member can be a double sided insulating tape or a double sided conductive tape.

According to one or more embodiments of the present disclosure, the heat radiation sheet portion can include a heat radiation sheet having the metal layer; a cushion sheet combined with the heat radiation sheet; and an adhesion sheet combined with the cushion sheet, wherein the bending panel fixing member and the spacer can be attached to the heat radiation sheet.

According to one or more embodiments of the present disclosure, the bending panel fixing member can be a double sided tape or a double sided conductive tape.

According to the embodiment of the present disclosure, an electronic device comprises a flexible display module combined with a cover window; a middle frame configured to support the cover window and combined with the flexible display module; and a back cover configured to cover a rear surface of the middle frame, wherein the flexible display module includes a flexible display panel including a display portion, a panel bending portion and a display pad portion; a heat radiation sheet portion combined with a rear surface of the flexible display panel; a bending panel fixing member attached to one edge portion of the heat radiation sheet portion and configured to fix the panel bending portion which is bent in a curved-line shape; and a frame fixing member attached between the heat radiation sheet portion and the middle frame.

According to one or more embodiments of the present disclosure, the frame fixing member can be a double sided insulating tape or a double sided conductive tape.

According to one or more embodiments of the present disclosure, the middle frame can include a metal material, and the frame fixing member is a double sided conductive tape.

According to one or more embodiments of the present disclosure, the flexible display panel can include a flexible substrate including the display portion, the panel bending portion and the display pad portion; a first back plate attached to the flexible substrate overlapped with the display portion; and a second back plate attached to the flexible substrate overlapped with the display pad portion, wherein the heat radiation sheet portion can be attached to a rear surface of the first back plate, and the bending panel fixing member can be interposed between the second back plate and the heat radiation sheet portion.

According to one or more embodiments of the present disclosure, the bending panel fixing member can be a double sided tape or a double sided conductive tape.

According to one or more embodiments of the present disclosure, the heat radiation sheet portion can include a heat radiation sheet having the metal layer; a cushion sheet combined with the heat radiation sheet; and an adhesion sheet combined with the cushion sheet, wherein the bending panel fixing member and the frame fixing member can be attached to the heat radiation sheet, and the adhesion sheet can be adhered onto the rear surface of the flexible display panel.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display, comprising;
   a flexible display module including:
      a flexible substrate on which a pixel array is formed;
      a heat radiation sheet portion disposed on a lower surface of the flexible substrate;
      a display portion; and
      a bending display portion;
   a cover window disposed on an upper surface of the flexible display module, the cover window including a sidewall portion overlapping the bending display portion of the flexible display module;
   a middle frame disposed on a rear surface of the flexible display module, the middle frame including a groove portion in the form of a mounting surface, at least one portion of the flexible display module being mounted onto the groove portion of the middle frame; and
   a back cover disposed on a rear surface of the middle frame,
   wherein a storage space is provided between the groove portion and the back cover.

2. The flexible display according to claim 1, further comprising an electronic circuit component disposed in the groove portion of the middle frame.

3. The flexible display according to claim 1, further comprising a frame fixing member disposed between the flexible display module and the middle frame.

4. The flexible display according to claim 3, wherein the frame fixing member is disposed in the groove portion of the middle frame.

5. The flexible display according to claim 3, wherein a width of the frame fixing member is smaller than a width of the heat radiation sheet portion.

6. The flexible display according to claim 3, wherein a width of the heat radiation sheet portion is smaller than a width of the groove portion of the middle frame.

7. The flexible display according to claim 3, wherein the frame fixing member is a double sided insulating tape or a double sided conductive tape.

8. The flexible display according to claim 1, wherein a width of the heat radiation sheet portion is smaller than a width of the flexible substrate.

9. The flexible display according to claim 1, wherein the frame fixing member overlaps the display portion of the flexible display module.

10. The flexible display according to claim 1, wherein the heat radiation sheet portion includes a metal layer.

11. The flexible display according to claim 1, further comprising a heat radiation member comprising a bending panel fixing member attached to a first area in a first surface of the heat radiation sheet portion.

12. The flexible display according to claim 11, further comprising:
   a spacer attached to a second area in the first surface of the heat radiation sheet portion; and
   a dummy double sided tape attached to the spacer.

13. The flexible display according to claim 12, further comprising an upper delamination film configured to cover an entire area of a second surface of the heat radiation sheet portion, the second surface of the heat radiation sheet portion being different than the first surface of the heat radiation sheet portion.

14. The flexible display according to claim 13, further comprising a lower delamination film configured to cover an entire area of the dummy double sided tape and an entire area of the bending panel fixing member.

15. The flexible display according to claim 12, wherein a total combined thickness of the spacer and the dummy double sided tape is identical to a thickness of the bending panel fixing member.

16. The flexible display according to claim 12, wherein an adhesion strength between the dummy double sided tape and the spacer is greater than an adhesion strength between the heat radiation sheet portion and the spacer.

17. The flexible display according to claim 12, wherein the heat radiation sheet portion includes:
   a heat radiation sheet having a metal layer;
   a cushion sheet attached to the heat radiation sheet; and
   an adhesion sheet attached to the cushion sheet, and
   wherein the bending panel fixing member and the spacer are attached to the heat radiation sheet.

18. The flexible display according to claim 1, wherein the middle frame includes a middle sidewall, and
   wherein the back cover is directly attached to the middle sidewall.

19. The flexible display according to claim 1, wherein the middle frame further includes a bottom groove portion forming a step surface with a bottom most surface of the middle frame, and wherein an entirety of the back cover is disposed within the bottom groove portion.

20. A flexible display, comprising;

a flexible display module including:
- a flexible substrate on which a pixel array is formed;
- a heat radiation sheet portion disposed on a lower surface of the flexible substrate;
- a display portion; and
- a bending display portion;

a cover window disposed on an upper surface of the flexible display module, the cover window including a sidewall portion overlapping the bending display portion of the flexible display module;

a middle frame disposed on a rear surface of the flexible display module, the middle frame including a groove portion;

a back cover disposed on a rear surface of the middle frame;

a heat radiation member comprising a bending panel fixing member attached to a first area in a first surface of the heat radiation sheet portion;

a spacer attached to a second area in the first surface of the heat radiation sheet portion;

a dummy double sided tape attached to the spacer;

an upper delamination film configured to cover an entire area of a second surface of the heat radiation sheet portion, the second surface of the heat radiation sheet portion being different than the first surface of the heat radiation sheet portion; and a lower delamination film configured to cover an entire area of the dummy double sided tape and an entire area of the bending panel fixing member, wherein a storage space is provided between the groove portion and the back cover, and wherein an adhesion strength between the lower delamination film and the bending panel fixing member is lower than an adhesion strength between the heat radiation sheet portion and the bending panel fixing member.

* * * * *